US008358682B2

(12) United States Patent
Asami

(10) Patent No.: US 8,358,682 B2
(45) Date of Patent: *Jan. 22, 2013

(54) SIGNAL PROCESSING APPARATUS, TEST SYSTEM, DISTORTION DETECTING APPARATUS, SIGNAL COMPENSATION APPARATUS, ANALYTIC SIGNAL GENERATING APPARATUS, RECORDING MEDIUM AND ANALYTIC SIGNAL GENERATING METHOD

(75) Inventor: Koji Asami, Saitama (JP)

(73) Assignee: Advantest Corporation, Tokyo (JP)

( * ) Notice: Subject to any disclaimer, the term of this patent is extended or adjusted under 35 U.S.C. 154(b) by 485 days.

This patent is subject to a terminal disclaimer.

(21) Appl. No.: 12/580,105

(22) Filed: Oct. 15, 2009

(65) Prior Publication Data

US 2010/0310006 A1    Dec. 9, 2010

(30) Foreign Application Priority Data

Oct. 16, 2008 (JP) ................................. 2008-267912
Feb. 4, 2009 (JP) ................................. 2009-023926

(51) Int. Cl.
*H04B 17/00* (2006.01)

(52) U.S. Cl. ........................................ 375/224; 375/259

(58) Field of Classification Search .......... 375/224–228, 375/259, 316, 324; 379/387.02; 324/607, 324/500, 67.11; 341/126, 127, 128, 155, 341/156, 159
See application file for complete search history.

(56) References Cited

U.S. PATENT DOCUMENTS 5,113,139 A    5/1992   Furukawa

FOREIGN PATENT DOCUMENTS

| JP | 3-296308 A | 12/1991 |
| JP | 7-209354 A | 11/1995 |

*Primary Examiner* — Sam K Ahn
*Assistant Examiner* — Janice Tieu

(57) ABSTRACT

Provided is a reference data converting section that rearranges each of a plurality of frequency components along the frequency axis such that (i) a fundamental wave component and harmonic wave components of a reference digital signal are within a first Nyquist region of a spectrum of the reference digital signal and (ii) image components of the fundamental wave component and the harmonic wave components are within a second Nyquist region of the spectrum; and a distortion detecting section that detects the non-linear distortion of the reference digital signal caused by each harmonic wave component, based on each harmonic wave component having a prescribed order number in the spectrum in which each frequency component has been rearranged by the reference data converting section.

32 Claims, 26 Drawing Sheets

SIGNAL PROCESSING APPARATUS, TEST SYSTEM, DISTORTION DETECTING APPARATUS, SIGNAL COMPENSATION APPARATUS, ANALYTIC SIGNAL GENERATING APPARATUS, RECORDING MEDIUM AND ANALYTIC SIGNAL GENERATING METHOD

BACKGROUND

1. Technical Field

The present invention relates to a signal processing apparatus, a test system, a distortion detecting apparatus, a signal compensation apparatus, an analytic signal generating apparatus, a recording medium, a distortion detecting method, a signal compensation method, and an analytic signal generating section.

2. Related Art

A semiconductor test apparatus measures several types of characteristics of a semiconductor device under test (DUT). For example, a semiconductor test apparatus may input to a semiconductor device a test signal generated by an arbitrary waveform generator (AWG). In this case, the measurement is performed after a waveform digitizer performs a high-speed and highly accurate digital conversion on the signal output from the semiconductor device. In this way, the semiconductor test apparatus can test whether the semiconductor device is operating properly.

Japanese Patent Application Publication No. 7-209354 and Japanese Patent Application Publication No. 3-296308 are related prior art documents.

The arbitrary waveform generator and the waveform digitizer include analog circuits that transmit analog signals. An ideal analog circuit outputs an analog signal having a prescribed frequency corresponding to the input signal. In practical application, however, the analog circuit outputs an analog signal that includes harmonic wave components caused by the non-linear characteristics of the elements in the analog circuit. As a result, waveform distortion occurs in the output signal.

SUMMARY

Therefore, it is an object of an aspect of the innovations herein to provide a signal processing apparatus, a test system, a distortion detecting apparatus, a signal compensation apparatus, an analytic signal generating apparatus, a recording medium, a distortion detecting method, a signal compensation method, and an analytic signal generating section, which are capable of overcoming the above drawbacks accompanying the related art. The above and other objects can be achieved by combinations described in the independent claims. The dependent claims define further advantageous and exemplary, combinations of the innovations herein.

According to a first aspect related to the innovations herein, one exemplary signal processing apparatus may include a signal processing apparatus comprising a digitizer that converts an input analog signal into a digital signal and a distortion identifying section that identities non-linear distortion in a reference digital signal generated by the digitizer when the digitizer is supplied with a reference analog signal. The distortion identifying section includes a reference spectrum calculating section that calculates a spectrum of the reference digital signal; a reference data converting section that rearranges each of a plurality of frequency components in the spectrum such that (i) a fundamental wave component and harmonic wave components of the reference digital signal are within a first Nyquist region of the spectrum of the reference digital signal and (ii) image components of the fundamental wave component and the harmonic wave components are within a second Nyquist region of the spectrum; and a distortion detecting section that detects the non-linear distortion of the reference digital signal caused by each harmonic wave component, based on each harmonic wave component having a prescribed order number in the spectrum in which each frequency component has been rearranged by the reference data converting section.

According to a second aspect related to the innovations herein, one exemplary test system may include a test system that tests a device under test, comprising (I) a signal processing apparatus comprising a digitizer that converts an input analog signal into a digital signal and a distortion identifying section that identities non-linear distortion in a reference digital signal generated by the digitizer when the digitizer is supplied with a reference analog signal, wherein the distortion identifying section includes a reference spectrum calculating section that calculates a spectrum of the reference digital signal; a reference data converting section that rearranges each of a plurality of frequency components in the spectrum such that (i) a fundamental wave component and harmonic wave components of the reference digital signal are within a first Nyquist region of the spectrum of the reference digital signal and (ii) image components of the fundamental wave component and the harmonic wave components are within a second Nyquist region of the spectrum; and a distortion detecting section that detects the non-linear distortion of the reference digital signal caused by each harmonic wave component, based on each harmonic wave component having a prescribed order number in the spectrum in which each frequency component has been rearranged by the reference data converting section, and (2) a judging section that judges acceptability of the device under test based on an output signal of the device under test received by the signal processing apparatus.

According to a third aspect related to the innovations herein, one exemplary distortion detecting method and apparatus may include a distortion detecting method using a distortion detecting apparatus that detects non-linear distortion in a target signal, comprising: a spectrum calculating section that calculates a spectrum of the target signal; a data converting section that rearranges each of a plurality of frequency components in the spectrum such that (i) a fundamental wave component and harmonic wave components of the target signal are within a first Nyquist region of the spectrum and (ii) image components of the fundamental wave component and the harmonic wave components are within a second Nyquist region of the spectrum; and a distortion detecting section that detects the non-linear distortion of the target signal caused by each harmonic wave component, based on each harmonic wave component having a prescribed order number in the spectrum in which each frequency component has been rearranged by the data converting section.

According to a fourth aspect related to the innovations herein, one exemplary signal compensation method and apparatus may include a signal compensation method using a signal compensation apparatus that compensates for non-linear distortion in a target signal, comprising an analytic signal generating section that generates an analytic signal of the target signal; a compensation signal generating section that generates compensation signals that compensate for the non-linear distortion of the target signal, based on signals obtained by raising the analytic signal to powers; and a compensating section that compensates for the non-linear distortion by subtracting each compensation signal from the target signal. The analytic signal generating section includes a spectrum calculating section that calculates a pre-compensated spectrum of the target signal by performing a Fourier transform on sampling data acquired by sampling, with a prescribed period, a signal level of the target signal; a data converting section that rearranges each of a plurality of frequency components in the pre-compensated spectrum such that (i) a fundamental wave component and harmonic wave components of the target signal are within a first Nyquist region of the pre-compensated spectrum and (ii) image components of the fundamental wave component and the harmonic wave components are within a second Nyquist region of the pre-compensated spectrum; a band limiting section that eliminates the frequency components in the second Nyquist region of the pre-compensated spectrum output by the data converting section; and an inverse Fourier transform section that generates the analytic signal by converting the pre-compensated spectrum output by the band limiting section into a signal in the time domain.

According to a fifth aspect related to the innovations herein, one exemplary analytic signal generating method and apparatus may include an analytic signal generating method using an analytic signal generating apparatus that generates an analytic signal of a target signal based on a sampling result of the target signal, comprising a spectrum calculating section that calculates a spectrum of the target signal by performing a Fourier transform on sampling data acquired by sampling, with a prescribed period, a signal level of the target signal; a data converting section that rearranges each of a plurality of frequency components in the spectrum such that (i) a fundamental wave component and harmonic wave components of the target signal are within a first Nyquist region of the spectrum and (ii) image components of the fundamental wave component and the harmonic wave components are within a second Nyquist region of the spectrum; a band limiting section that eliminates the frequency components in the second Nyquist region of the spectrum output by the data converting section; and an analytic signal generating section that generates the analytic signal by converting the spectrum output by the band limiting section into a signal in the time domain.

According to a sixth aspect related to the innovations herein, one exemplary recording medium may include a recording medium storing thereon a program that causes a computer to function as a distortion detecting apparatus for detecting non-linear distortion of a target signal, the program causing the computer to function as a spectrum calculating section that calculates a spectrum of the target signal; a data converting section that rearranges each of a plurality of frequency components in the spectrum such that (i) a fundamental wave component and harmonic wave components of the target signal are within a first Nyquist region of the spectrum and (ii) image components of the fundamental wave component and the harmonic wave components are within a second Nyquist region of the spectrum; and a distortion detecting section that detects the non-linear distortion of the target signal caused by each harmonic wave component, based on each harmonic wave component having a prescribed order number in the spectrum in which each frequency component has been rearranged by the data converting section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
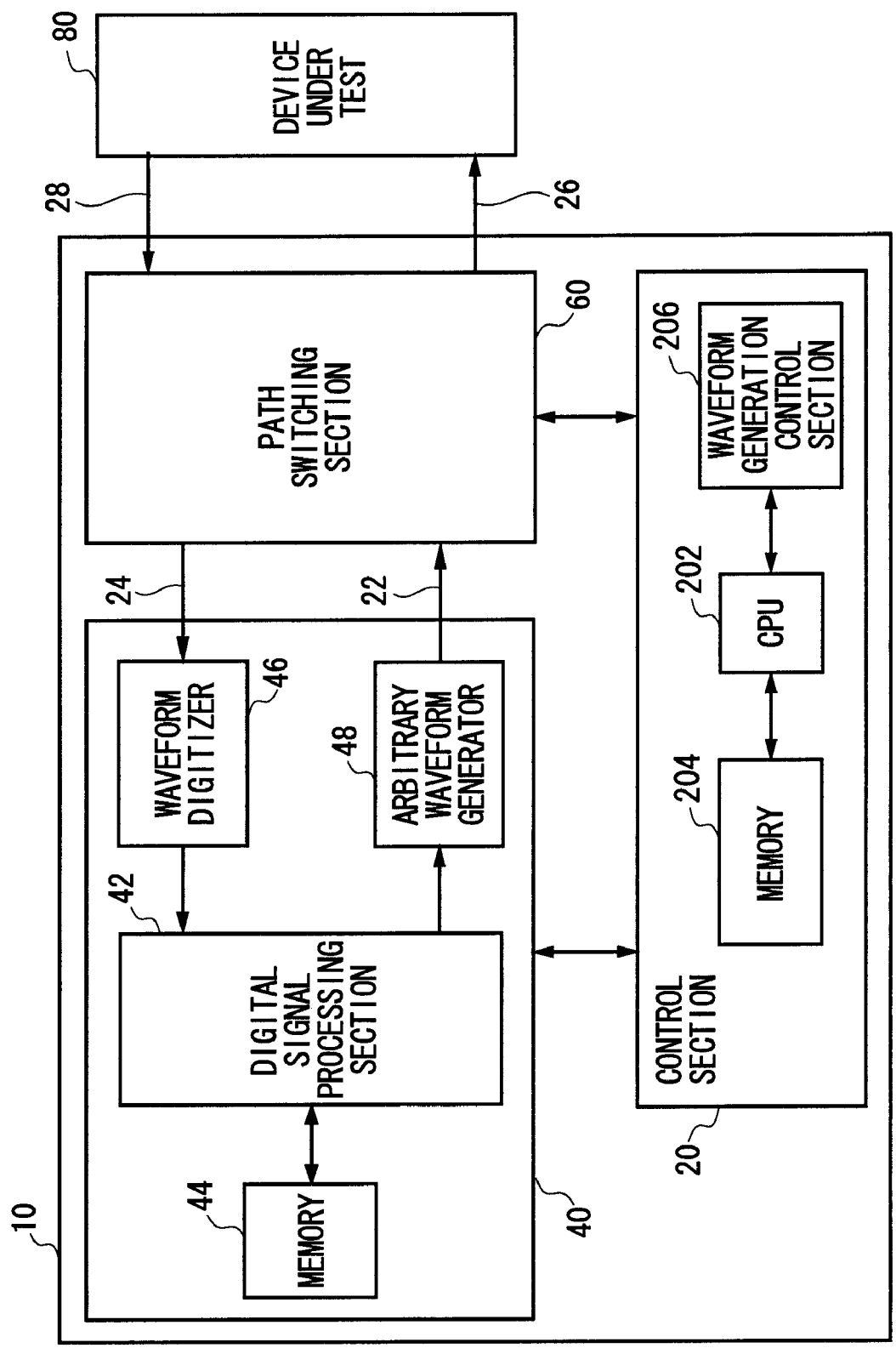
FIG. 1 shows an exemplary configuration of a semiconductor test apparatus, which is an embodiment of the test apparatus according to the present invention.

FIG. 1 shows an exemplary configuration of a semiconductor test apparatus 10, which is an embodiment of the test apparatus according to the present invention. The semiconductor test apparatus 10 includes a control section 20, a testing section 40, and a path switching section 60. The semiconductor test apparatus 10 is connected to a device under test 80 via a signal line 26 and a signal line 28. The semiconductor test apparatus 10 tests the device under test 80 by inputting a signal to the device under test 80 and measuring a response signal from the device under test 80.

The control section 20 performs overall control of the semiconductor test apparatus 10. The control section 20 includes a CPU 202, a memory 204, and a waveform generation control section 206. The testing section 40 includes a digital signal processing section 42, a memory 44, a waveform digitizer 46, and an arbitrary waveform generator 48. The digital signal processing section 42 uses data stored in the memory 44 to output a digital signal to the arbitrary waveform generator 48 according to instructions from the control section 20. The digital signal processing section 42 may identify and compensate for non-linear distortion occurring in the signals output by the waveform digitizer 46 and the arbitrary waveform generator 48.

The arbitrary waveform generator 48 converts the digital signal received from the digital signal processing section 42 into an analog signal, and then outputs the analog signal to the device under test 80 via the signal line 22. The waveform digitizer 46 converts the analog signal received from the device under test 80 via the signal line 24 into a digital signal. The digital signal processing section 42 analyzes the signal that is digitally converted by the waveform digitizer 46.

The control section 20 may perform calibration of the semiconductor test apparatus 10 based on a program stored in the memory 204. This calibration may be a process for identifying and compensating for non-linear distortion occurring in the signals output by the waveform digitizer 46 and the arbitrary waveform generator 48.

When calibration is performed for the waveform digitizer 46, the waveform generation control section 206 may cause the arbitrary waveform generator 48 to output a prescribed reference signal, and input this reference signal to the waveform digitizer 46 through a noise removal filter. When calibration is performed for the arbitrary waveform generator 48 after calibration of the waveform digitizer 46, the waveform generation control section 206 may cause the arbitrary waveform generator 48 to output a prescribed analog signal, and input this analog signal to the waveform digitizer 46 without passing through the noise removal filter.

Figure 2:
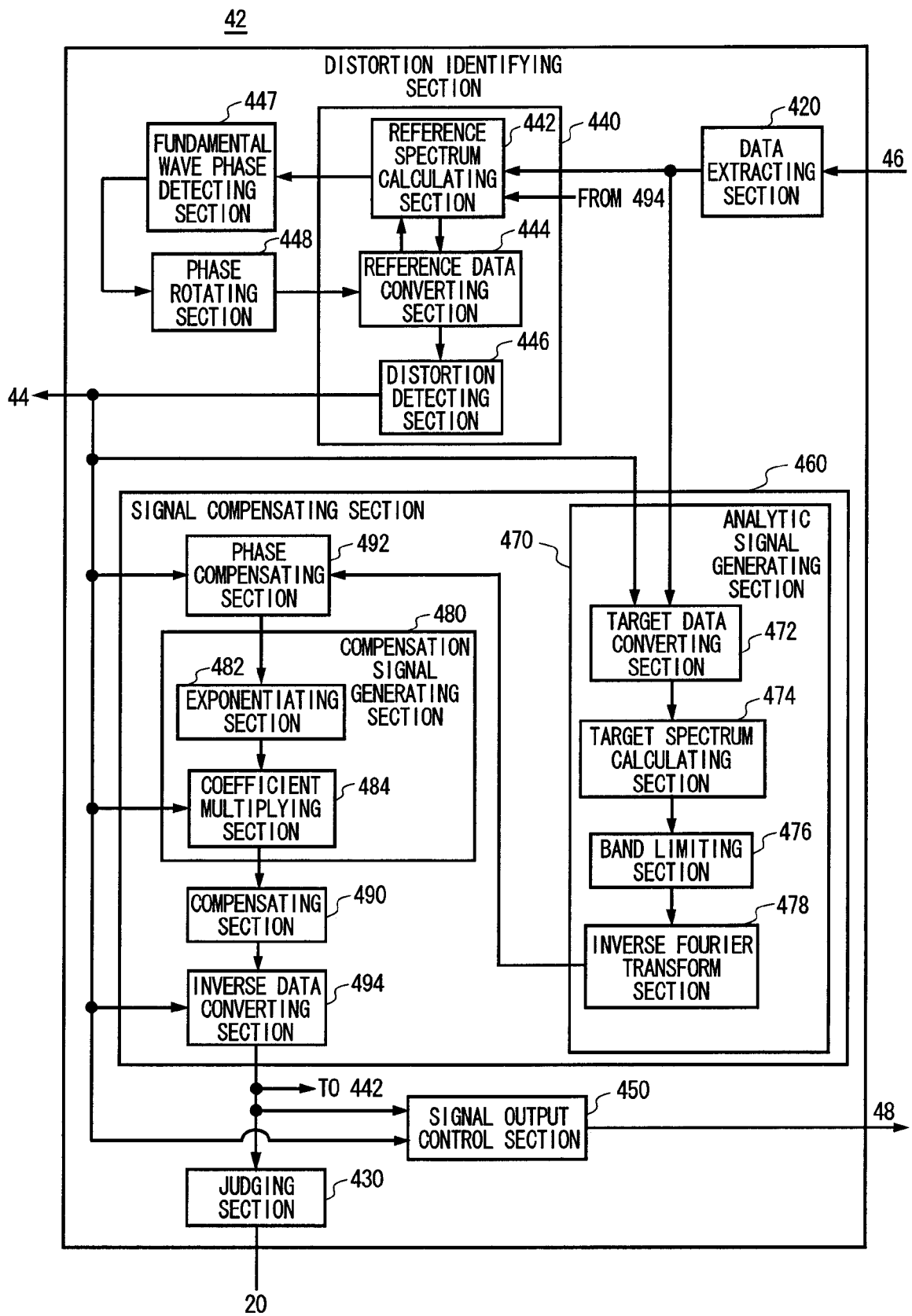
FIG. 2 shows a functional configuration of a portion of the digital signal processing section for performing calibration.

FIG. 2 shows a functional configuration of a portion of the digital signal processing section 42 for calibrating the waveform digitizer 46 and the arbitrary waveform generator 48. The digital signal processing section 42 includes a fundamental wave phase detecting section 447, a phase rotating section 448, a distortion identifying section 440, a data extracting section 420, a judging section 430, a signal output control section 450, and a signal compensating section 460. When performing calibration, the digital signal processing section 42 identifies the non-linear distortion occurring in the signals output by the waveform digitizer 46 and the arbitrary waveform generator 48.

When supplying a signal to the device under test 80, the digital signal processing section 42 compensates for the non-linear distortion of the arbitrary waveform generator 48 based on the non-linear distortion of the arbitrary waveform generator 48 that has already been identified. Based on the identified non-linear distortion, the digital signal processing section 42 may generate a compensation coefficient used when compensating for the non-linear distortion. For example, the digital signal processing section 42 may compensate the waveform data supplied from the signal output control section 450 to the arbitrary waveform generator 48 based on this compensation coefficient, or may compensate the waveform of the signal output by the arbitrary waveform generator 48 based on this compensation coefficient.

When measuring the response signal from the device under test 80, the digital signal processing section 42 compensates for the non-linear distortion in the waveform digitizer 46 based on the non-linear distortion of the waveform digitizer 46 that has already been identified. Based on the identified non-linear distortion of the waveform digitizer 46, the digital signal processing section 42 may generate a compensation coefficient used when compensating for the non-linear distortion. For example, the digital signal processing section 42 may compensate the waveform data output by the waveform digitizer 46 based on this compensation coefficient. The judging section 430 judges acceptability of the device under test 80 based on the compensated output of the waveform digitizer 46.

The following is a description of functions performed by each component of the digital signal processing section 42 during calibration. The function of each component of the digital signal processing section 42 may be realized by a computer operating in accordance with a prescribed program.

The first description involves the function of the digital signal processing section 42 for identifying the non-linear distortion in the waveform digitizer 46. In this case, it is desirable that a signal having no non-linear distortion be input to the waveform digitizer 46. The non-linear distortion caused by the waveform digitizer 46 can be identified by detecting harmonic waves occurring in the output of the waveform digitizer 46 into which the signal having no non-linear distortion is input. The digital signal processing section 42 in the present example identifies amplitude components and phase components of the non-linear distortion by detecting the amplitude and the phase of the harmonic waves occurring in the output of the waveform digitizer 46.

In the present example, the arbitrary waveform generator 48 outputs a prescribed reference analog signal, and this reference analog signal is input to the waveform digitizer 46. At this time, in order to decrease the harmonic waves in the reference analog signal, a noise removal filter such as a low-pass filter may be provided between the arbitrary waveform generator 48 and the waveform digitizer 46. As another example, a reference analog signal without non-linear distortion may be input to the waveform digitizer 46 from an external signal source.

Figure 3:
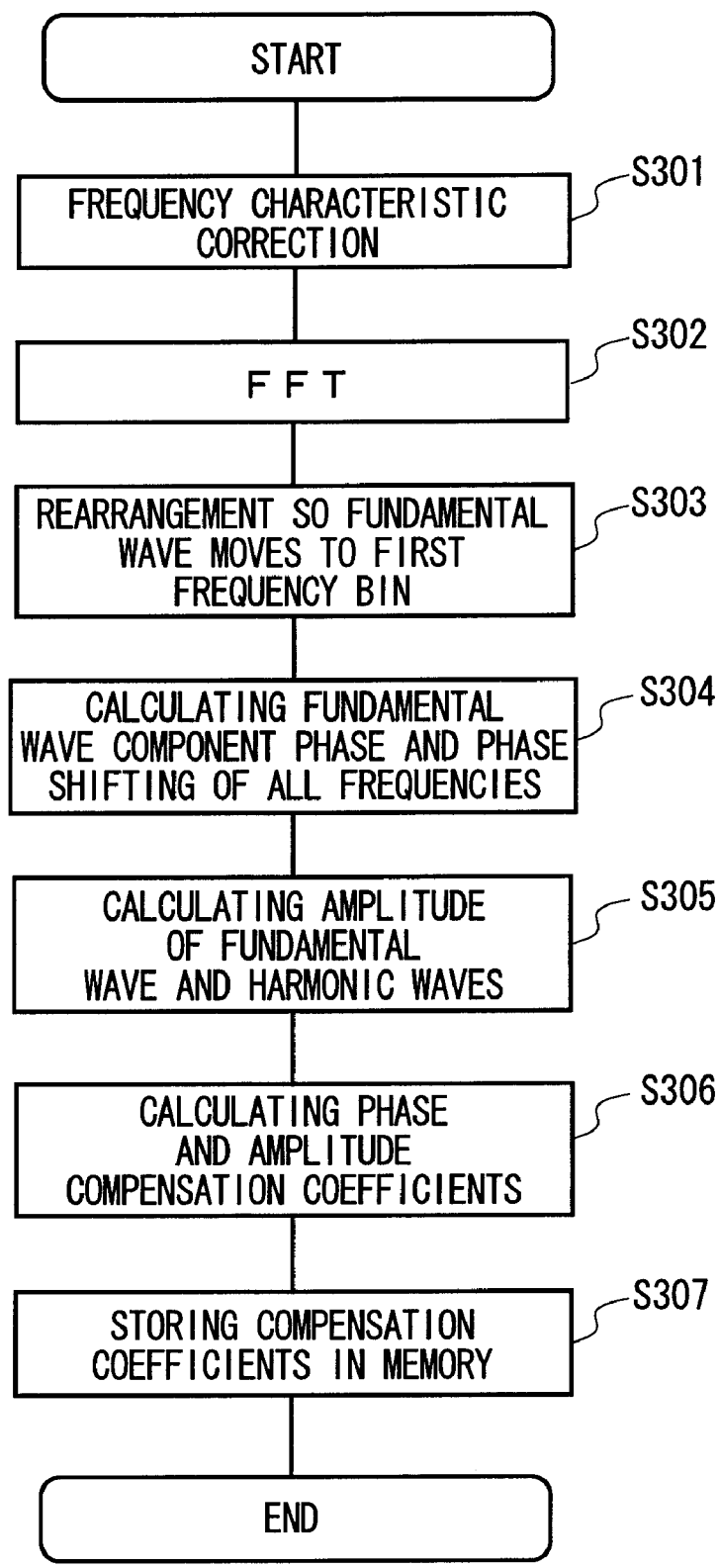
FIG. 3 is a flow chart showing the identification process for the waveform digitizer.

FIG. 3 is a flow chart showing the process of identifying the non-linear distortion caused by the waveform digitizer 46. The data extracting section 420 receives data of the reference digital signal output by the waveform digitizer 46 in response to the reference analog signal. Furthermore, the data extracting section 420 extracts, from the data of the reference digital signal, a duration of data corresponding to an integer multiple of the period of the reference analog signal. The data extracting section 420 may perform frequency characteristic correction to cancel out frequency characteristics of circuits in the waveform digitizer 46 (S301). For example, the data extracting section 420 may correct output data of the waveform digitizer 46 using a filter or the like that has a frequency characteristic that is the inverse of the frequency characteristic of the gain between input and output in the waveform digitizer 46.

The distortion identifying section 440 includes a reference spectrum calculating section 442, a reference data converting section 444, and a distortion detecting section 446, and identifies the non-linear distortion occurring in the waveform digitizer 46. The reference spectrum calculating section 442 calculates the spectrum of the reference digital signal output by the waveform digitizer 46, based on the data extracted by the data extracting section 420. The reference spectrum calculating section 442 may calculate the spectrum of the reference digital signal by performing a Fourier transform on the data extracted by the data extracting section 420 (S302).

Figure 4:
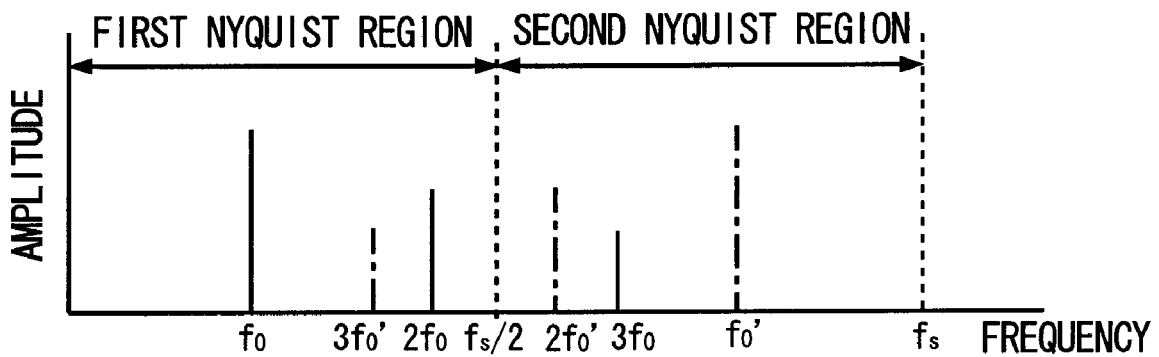
FIG. 4 shows an exemplary spectrum calculated by the reference spectrum calculating section.

FIG. 4 shows an exemplary spectrum calculated by the reference spectrum calculating section 442. In FIG. 4, the frequency components $f_0$, $2f_0$, and $3f_0$ represent the fundamental wave component, the second-order harmonic wave component, and the third-order harmonic wave component of the reference digital signal. The frequency components $f_0'$, $2f_0'$, and $3f_0'$ represent image components of the fundamental wave component, the second-order harmonic wave component, and the third-order harmonic wave component. FIG. 4 shows an amplitude spectrum that includes the harmonic wave components up to the third order, but this spectrum may include higher-order harmonic wave components.

At step S303 shown in FIG. 3, the reference data converting section 444 rearranges each frequency component in the spectrum of the reference digital signal along a frequency axis, such that the fundamental wave component and the harmonic wave components of the reference digital signal are within a first Nyquist region of the spectrum of the reference digital signal. Furthermore, the reference data converting section 444 rearranges each frequency component in the spectrum of the reference digital signal along a frequency axis, such that the image components of the fundamental wave component and the harmonic wave components are within a second Nyquist region of the spectrum of the reference digital signal. For example, the reference data converting section 444 may rearrange the frequency components of the spectrum by moving the fundamental wave component to the first frequency bin of the rearranged spectrum and moving a k-order harmonic wave component to a k-th frequency bin. The reference data converting section 444 may rearrange the frequency components in the same way for the amplitude spectrum and the phase spectrum of the reference digital signal. Here, k is a natural number.

The first Nyquist region refers to a frequency region from 0 to fs/2 or a frequency region from fs/2 to fs, where fs is the sampling frequency of the waveform digitizer 46. The second Nyquist region is whichever of the above-described frequency regions is not the first Nyquist region.

Figure 5:
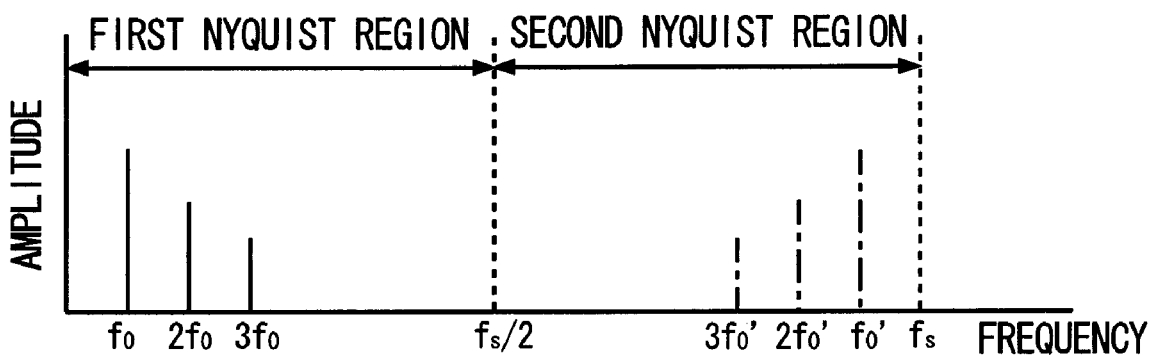
FIG. 5 shows an exemplary rearranged spectrum output by the reference data converting section.

FIG. 5 shows an exemplary rearranged spectrum output by the reference data converting section 444. As described above, in the rearranged spectrum, the fundamental wave component and the harmonic wave components of the reference digital signal are in the first Nyquist region, and the image components are in the second Nyquist region.

At step S304 of FIG. 3, the fundamental wave phase detecting section 447 detects the phase of the fundamental wave component of the reference digital signal based on the spectrum calculated by the reference spectrum calculating section 442. For example, the fundamental wave phase detecting section 447 may detect the phase of the fundamental wave component based on the phase spectrum calculated by the reference spectrum calculating section 442. Instead, the fundamental wave phase detecting section 447 may detect the phase of the fundamental wave component based on the phase spectrum calculated by the reference data converting section 444. The fundamental wave phase detecting section 447 notifies the phase rotating section 448 about the detected phase of the fundamental wave component.

The phase rotating section 448 rotates the phase of each frequency component, in the spectrum in which each frequency component has been rearranged by the reference data converting section 444, based on the phase of the fundamental wave component. For example, the phase rotating section 448 may rotate the phase of each frequency component by (i) multiplying the fundamental wave component and the harmonic wave components by $e^{\wedge}(-j\omega\theta_0)$ and (ii) multiplying the image components by $e^{\wedge}(j\omega\theta_0)$. Here, $\theta_0$ represents the phase of the fundamental wave component and $\omega$ represents the frequency of each component.

In the present example, the reference data converting section 444 gathers the fundamental wave component and the harmonic wave components of the reference digital signal in the first Nyquist region, and gathers the image components in the second Nyquist region. Therefore, the phase rotating section 448 can easily rotate the phase of each frequency by (i) multiplying each frequency component in the first Nyquist region by $e^{\wedge}(-j\omega\theta_0)$ and (ii) multiplying each frequency component in the second Nyquist region by $e^{\wedge}(j\omega\theta_0)$.

Next, at step S305, the distortion detecting section 446 detects the non-linear distortion in the reference digital signal caused by each harmonic wave component, in the spectrum in which each frequency component was rearranged by the reference data converting section 444, based on each harmonic wave component of a prescribed order. For example, when compensating for non-linear distortion caused by harmonic wave components up to the third order, the distortion detecting section 446 may detect the amplitude $H_2$ and the phase $\theta_2$ of the second-order harmonic wave component and the amplitude $H_3$ and the phase $\theta_3$ of the third-order harmonic wave component.

Here, the prescribed order numbers may be designated by a user or the like. For example, when the user designates harmonic wave components up to the third order, the distortion detecting section 446 may detect the amplitude and the phase of the fundamental wave component, the second-order harmonic wave component, and the third-order harmonic wave component in the rearranged spectrum. In the present example, regardless of the values of the frequencies of the fundamental wave component and the harmonic wave components, these components are each moved to a certain frequency bin in the rearranged spectrum. Therefore, the distortion detecting section 446 can easily detect the amplitude and the phase of the fundamental wave component and the harmonic wave components by detecting the amplitude and the phase of the spectrum at a predetermined frequency bin.

Furthermore, the distortion detecting section 446 may calculate a compensation coefficient that compensates for the amplitude component of the non-linear distortion and a compensation coefficient that compensates for the phase component of the non-linear distortion, based on the detected amplitude and phase (S306). The distortion detecting section 446 may store these distortion compensation coefficients in the memory 44 (S307). As a result of the above process, the non-linear distortion caused by the waveform digitizer 46 can be identified.

The following describes a function performed by the signal compensating section 460 when compensating for non-linear distortion in the digital signal output by the waveform digitizer 46. The signal compensating section 460 compensates for non-linear distortion in the digital signal generated by the waveform digitizer 46 using compensation coefficients that are calculated by the distortion identifying section 440 based on the reference digital signal. In order to compensate for the amplitude component and the phase component of the non-linear distortion, the signal compensating section 460 generates an analytic signal by converting the digital signal output by the waveform digitizer 46 into a complex-valued signal. The signal compensating section 460 of the present embodiment includes an analytic signal generating section 470, a compensation signal generating section 480, a compensating section 490, a phase compensating section 492, and an inverse data converting section 494.

The analytic signal generating section 470 generates the analytic signal of the digital signal output by the waveform digitizer 46. For example, the analytic signal generating section 470 may generate an analytic signal that has the digital signal as the real part and has, as the imaginary part, a signal obtained by shifting the phase of the digital signal by 90 degrees. The analytic signal generating section 470 may generate the analytic signal by generating the Hilbert transform pair of the digital signal. The analytic signal generating section 470 of the present embodiment includes a target data converting section 472, a target spectrum calculating section 474, a band limiting section 476, and an inverse Fourier transform section 478.

Figure 6:
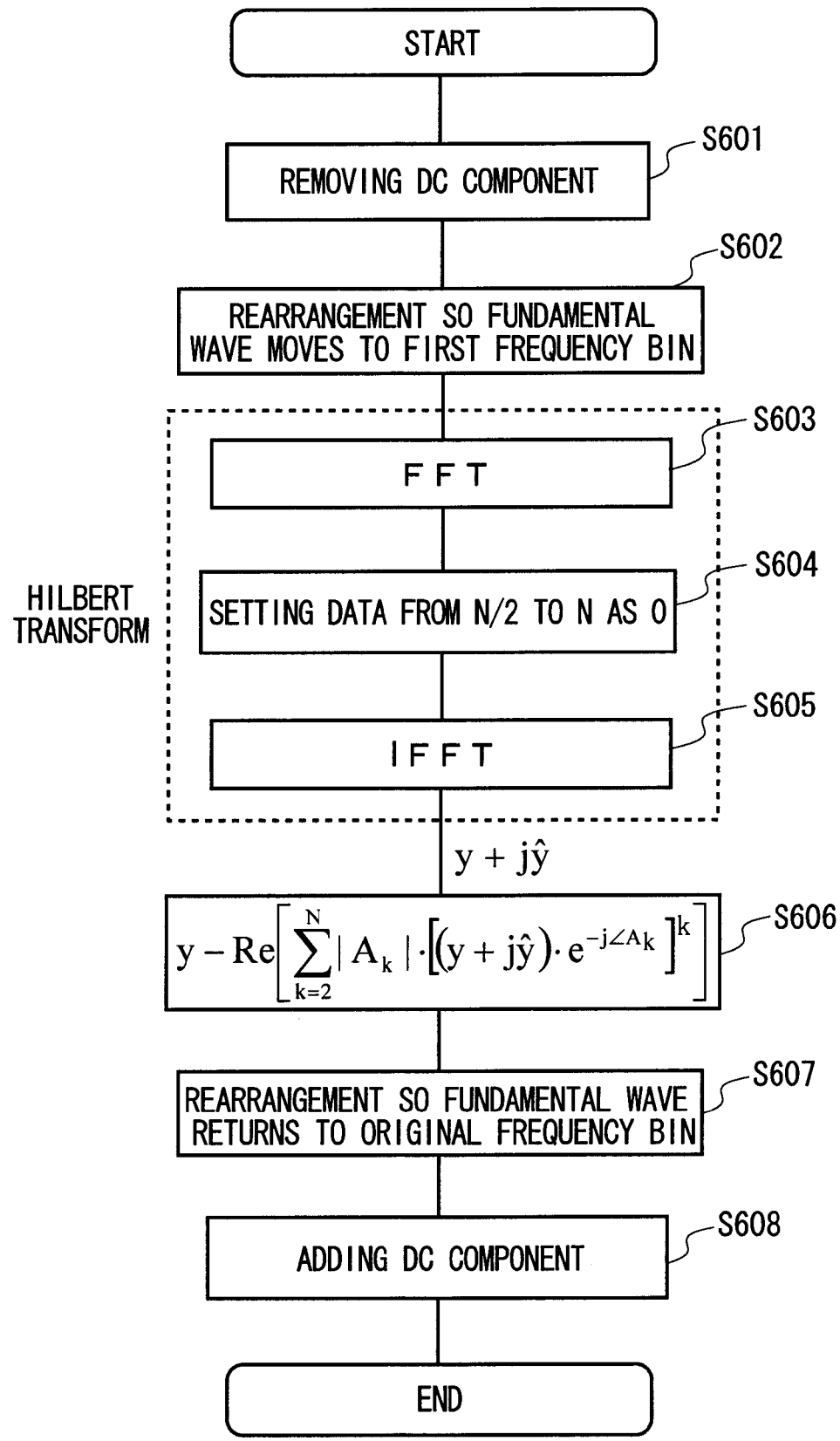
FIG. 6 is a first exemplary flow chart showing the process of compensating for the waveform digitizer and the arbitrary waveform generator.

FIG. 6 is a flow chart showing the process of compensating for the non-linear distortion of the waveform digitizer 46. The target data converting section 472 calculates the DC component included in the digital signal and stores the calculated value in the memory 44. The target data converting section 472 removes the DC component from the digital signal (S601). The target data converting section 472 may calculate the value of the DC component by calculating an average value of the waveform level of the digital signal. The DC component includes an alias component of the second-order harmonic wave, and the size of the second-order harmonic wave alias component is substantially equal to the amplitude of the second-order harmonic wave.

Next, the target data converting section 472 rearranges each frequency component in the pre-compensated spectrum such that (i) the fundamental wave component and the harmonic wave components of the digital signal are in the first Nyquist region of the pre-compensated spectrum and (ii) the image components of the fundamental wave component and the harmonic wave components are in the second Nyquist region of the pre-compensated spectrum (S602). The process performed by the target data converting section 472 may convert the frequency by rearranging the data of the digital signal along the time axis. Instead, the process performed by the target data converting section 472 may be the same as the process performed by the reference data converting section 444.

The target spectrum calculating section 474 performs a Fourier transform on the digital signal received from the waveform digitizer 46 to calculate the pre-compensated spectrum of the digital signal (S603). The band limiting section 476 eliminates the frequency components in the second Nyquist region from the pre-compensated spectrum in which the frequency components have been rearranged by the target data converting section 472 (S604). The inverse Fourier transform section 478 performs an inverse Fourier transform on the pre-compensated spectrum output by the band limiting section 476 (S605). The target data converting section 472 gathers the fundamental wave component and the harmonic wave components of the digital signal in the first Nyquist region of the pre-compensated spectrum, and gathers the image components of the fundamental wave component and the harmonic wave components in the second Nyquist region of the pre-compensated spectrum. Therefore, the analytic signal can be easily generated by eliminating the frequency components in the second Nyquist region and performing an inverse Fourier transform.

The phase compensating section 492, the compensation signal generating section 480, and the compensating section 490 compensate for the non-linear distortion in the digital signal based on the analytic signal generated by the analytic signal generating section 470 and the non-linear distortion identified by the distortion identifying section 440. The compensation signal generating section 480 of the present embodiment includes an exponentiating section 482 and a coefficient multiplying section 484.

The phase compensating section 492 compensates the phase of the analytic signal generated by the analytic signal generating section 470, based on the compensation coefficients of the waveform digitizer 46 stored in the memory 44. The exponentiating section 482 generates exponentiated signals obtained by raising the analytic signal to a power equal to the order of a corresponding harmonic wave component from among the harmonic wave components having the prescribed orders in the digital signal. For example, when compensating for the non-linear distortion caused by harmonic wave components up to the third order, the exponentiating section 482 generates (i) an exponentiated signal obtained by raising to the second power the analytic signal whose phase is shifted by $\theta_2$ and (ii) an exponentiated signal obtained by raising to the third power the analytic signal whose phase is shifted by $\theta_3$.

The coefficient multiplying section 484 generates compensation signals by multiplying (i) each exponentiated signal generated by the exponentiating section 482 by (ii) the compensation coefficient corresponding to the amplitude component of the non-linear distortion caused by each harmonic wave component and identified by the distortion detecting section 446. For example, when compensating for the non-linear distortion caused by harmonic wave components up to the third order, the coefficient multiplying section 484 multiplies the compensation coefficient corresponding to the second-order harmonic wave component calculated by the distortion detecting section 446 by the analytic signal raised to the second power, and multiplies the compensation coefficient corresponding to the third-order harmonic wave component by the analytic signal raised to the third power.

The compensating section 490 compensates for the non-linear distortion in the digital signal by subtracting, from the digital signal output by the waveform digitizer 46, each compensation signal generated by the coefficient multiplying section 484. The compensating section 490 may subtract the real part of each compensation signal from the digital signal (S606).

The inverse data converting section 494 rearranges each frequency component in the compensated spectrum such that the frequency of each component in the compensated spectrum of the digital signal output by the compensating section 490 returns to the original frequency of the component prior to being moved by the target data converting section 472. Each frequency component may be rearranged by rearranging the data points on the time axis, or by rearranging the spectrum on the frequency axis (S607). Finally, after reading the value of the DC component stored in the memory 44 at step S601, the inverse data converting section 494 subtracts the amplitude value of the second-order harmonic wave component from the read value (S608). The inverse data converting section 494 adds the DC component from which the amplitude value has been subtracted to the compensated signal. After this step, the compensation process for the waveform digitizer 46 is finished.

Figure 7:
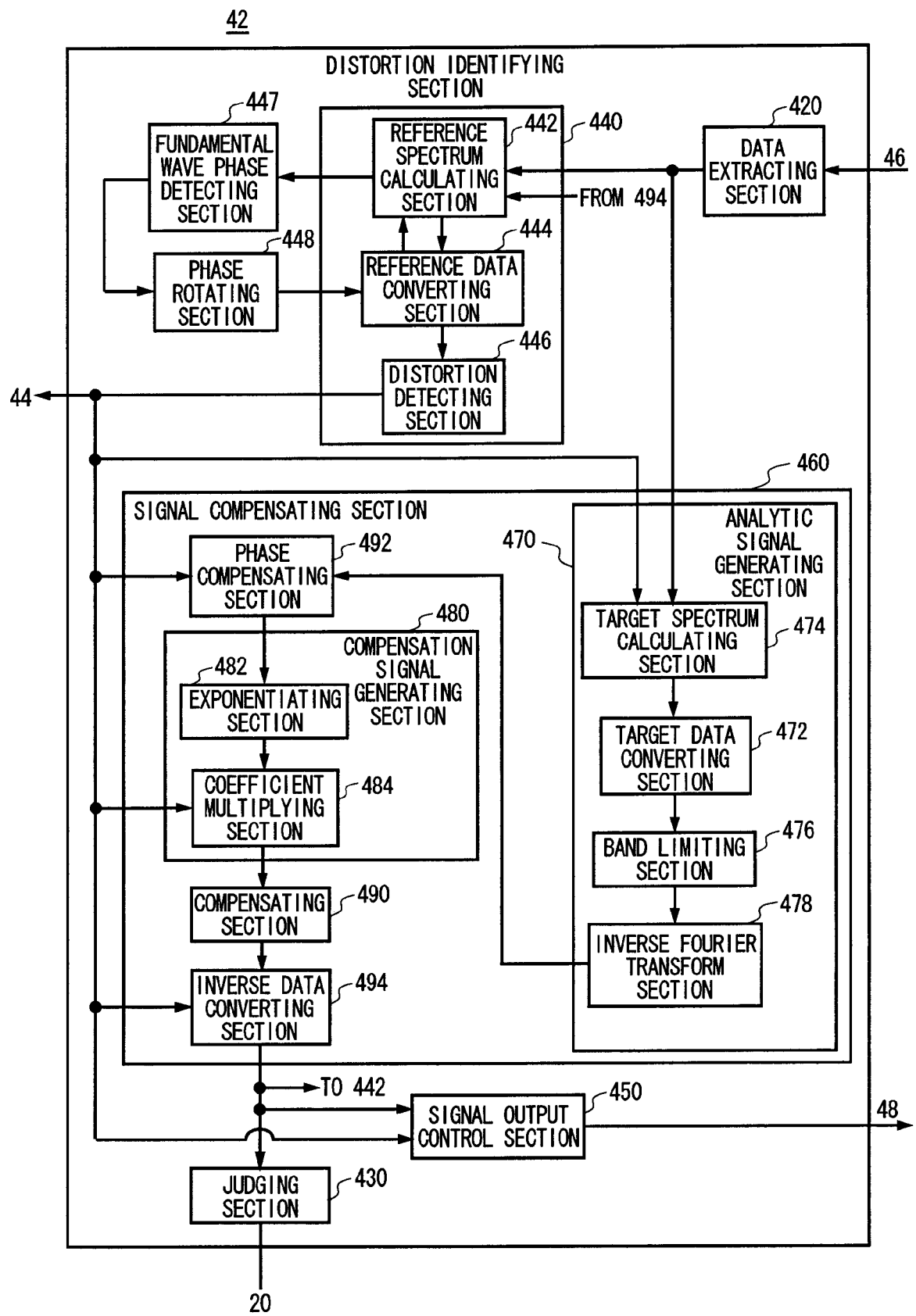
FIG. 7 shows a second example of functional configuration of a portion of the digital signal processing section for performing calibration.
Figure 8:
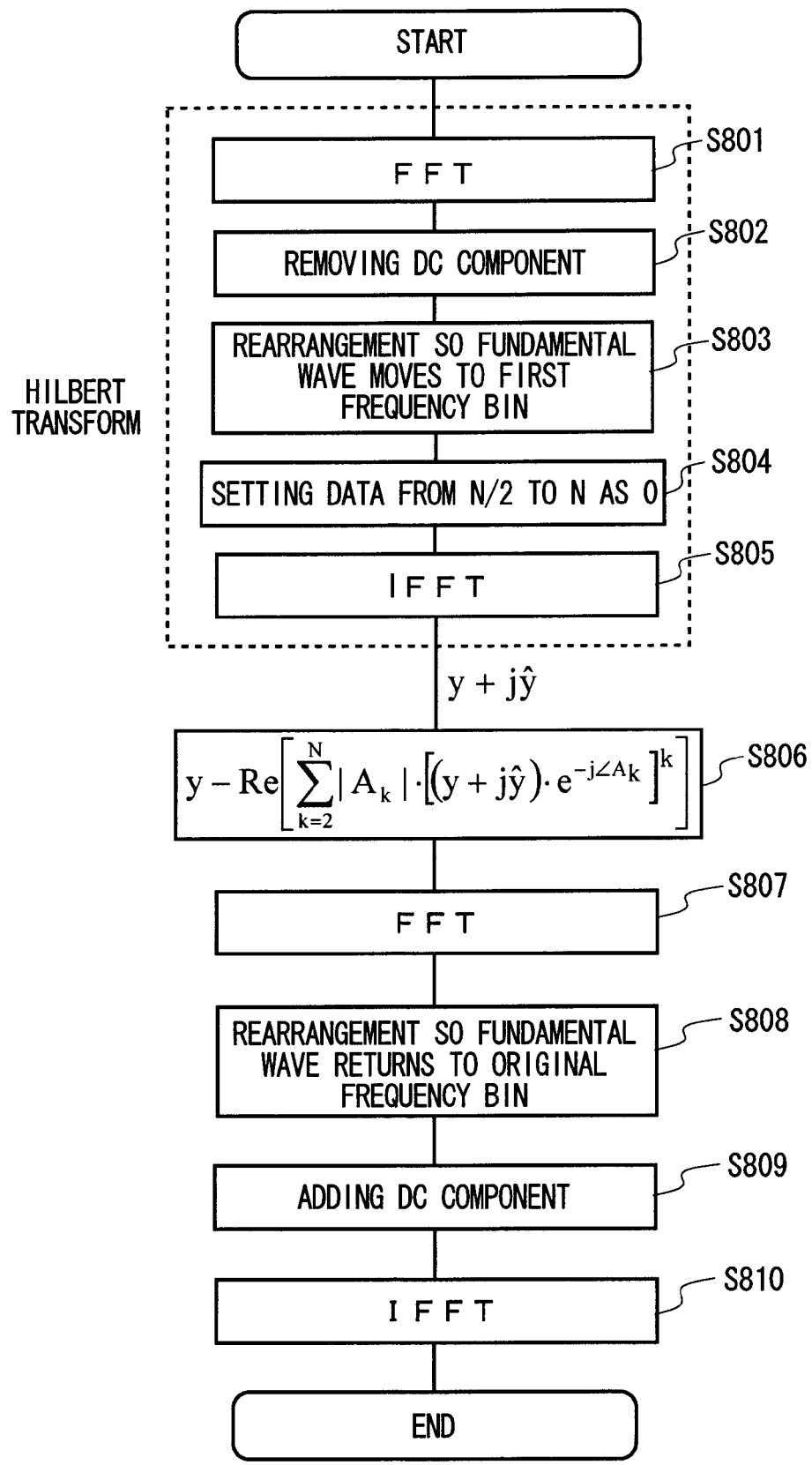
FIG. 8 is a second exemplary flow chart showing the process of compensating for the waveform digitizer and the arbitrary waveform generator.

FIG. 7 shows functional sections of the digital signal processing section 42 in a modification of the process performed by the waveform digitizer 46 to compensate for the non-linear distortion. FIG. 8 is a flow chart showing a modification of the process performed by the waveform digitizer 46 to compensate for the non-linear distortion. The target spectrum calculating section 474 performs a Fourier transform on the digital signal received from the waveform digitizer 46 to calculate the pre-compensated spectrum of the digital signal (S801).

Next, the target spectrum calculating section 474 removes the DC component from the calculated spectrum (S802) and stores the size of the removed DC component in the memory 44. The target data converting section 472 rearranges each frequency component in the pre-compensated spectrum such that (i) the fundamental wave component and the harmonic wave components of the digital signal are in the first Nyquist region of the pre-compensated spectrum and (ii) the image components of the fundamental wave component and the harmonic wave components are in the second Nyquist region of the pre-compensated spectrum (S803). The process performed by the target data converting section 472 may be the same as the process performed by the reference data converting section 444.

The band limiting section 476 eliminates the frequency components in the second Nyquist region from the pre-compensated spectrum in which the frequency components have been rearranged by the target data converting section 472 (S804). The inverse Fourier transform section 478 performs an inverse Fourier transform on the pre-compensated spectrum output by the band limiting section 476 (S805).

Next, in the same manner as described in step S606 of FIG. 6, the phase compensating section 492, the compensation signal generating section 480, and the compensating section 490 calculate the compensated data (S806). After performing the Fourier transform on the compensated data (S807), the inverse data converting section 494 rearranges the compensated spectrum such that the fundamental wave returns to its original frequency bin (S808). Furthermore, the inverse data converting section 494 reads the size of the DC component stored in the memory 44 at step S802, and subtracts from the read value the amplitude value of the second-order harmonic wave component calculated at S801. The inverse data converting section 494 adds the resulting DC component to the compensated signal (S809) and then performs an inverse Fourier transform (S810). After this step, the compensation process of the waveform digitizer 46 is finished.

Upon completion of the compensation process, the judging section 430 judges acceptability of the device based on the compensated signal received from the compensating section 490. The judging section 430 may also notify the control section 20 concerning the acceptability judgment result.

The following describes a function of the digital signal processing section 42 for identifying non-linear distortion caused by the arbitrary waveform generator 48. The digital signal processing section 42 identifies the non-linear distortion caused by the arbitrary waveform generator 48 after the calibration of the waveform digitizer 46.

Figure 9:
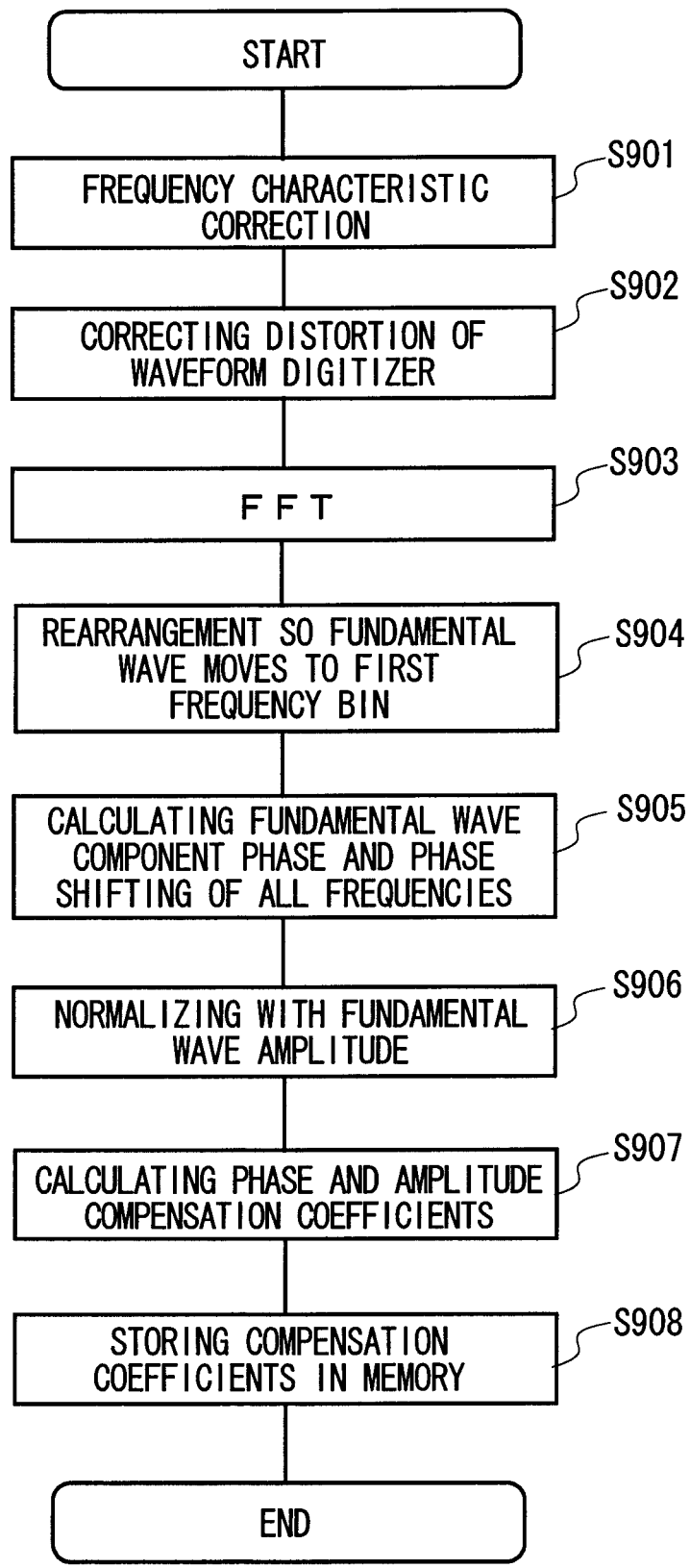
FIG. 9 is a flow chart showing the identification process for the arbitrary waveform generator.

FIG. 9 is a flow chart showing the process for identifying the non-linear distortion caused by the arbitrary waveform generator 48. The data extracting section 420 receives the reference digital signal from the waveform digitizer 46. The reference digital signal is obtained by the waveform digitizer 46 performing a digital conversion on the reference analog signal transmitted from the arbitrary waveform generator 48. The data extracting section 420 extracts, from the data of the reference digital signal, a duration of data corresponding to an integer multiple of the period of the reference analog signal. The data extracting section 420 may perform frequency characteristic correction to cancel out frequency characteristics of circuits at the output stage of the waveform digitizer 46 (S901). For example, the data extracting section 420 may correct the reference digital signal received via the waveform digitizer 46 using a filter or the like that has a frequency characteristic that is the inverse of the frequency characteristic of the gain between input and output in the arbitrary waveform generator 48.

In the same manner as the process described in FIG. 6 or FIG. 8, the signal compensating section 460 compensates for the non-linear distortion in the received reference digital signal caused by the waveform digitizer 46 (S902). In order to compensate for the non-linear distortion caused by the arbitrary waveform generator 48 in the compensated reference digital signal, the signal compensating section 460 outputs the reference digital signal to the distortion identifying section 440 after compensating for the non-linear distortion caused by the waveform digitizer 46. Using the same identifying process as for the waveform digitizer 46, the distortion identifying section 440 identifies the distortion of the arbitrary waveform generator 48 and calculates compensation coefficients for the arbitrary waveform generator 48.

More specifically, the reference spectrum calculating section 442 calculates the spectrum of the reference digital signal by performing a Fourier transform on the data received from the signal compensating section 460 (S903). Next, the reference data converting section 444 rearranges each frequency component in the spectrum of the reference digital signal along a frequency axis, such that the fundamental wave component and the harmonic wave components of the reference digital signal are within a first Nyquist region of the spectrum of the reference digital signal (S904).

The fundamental wave phase detecting section 447 detects the phase of the fundamental wave component of the reference digital signal based on the spectrum calculated by the reference spectrum calculating section 442, and notifies the phase rotating section 448 concerning the detected phase of the fundamental wave component. The phase rotating section 448 rotates the phase of each frequency component, in the spectrum in which each frequency component was rearranged by the reference data converting section 444, based on the phase of the fundamental wave component (S905). In the present example, the reference data converting section 444 gathers the fundamental wave component and the harmonic wave components of the reference digital signal in the first Nyquist region, and gathers the image components in the second Nyquist region. Therefore, the phase rotating section 448 can easily rotate the phase of each frequency by (i) multiplying each frequency component in the first Nyquist region by $e^{\wedge}(-j\omega\theta_0)$ and (ii) multiplying each frequency component in the second Nyquist region by $e^{\wedge}(j\omega\theta_0)$.

The distortion detecting section 446 detects the non-linear distortion in the reference digital signal caused by each harmonic wave component, in the spectrum in which each frequency component has been rearranged by the reference data converting section 444, based on each harmonic wave component of a prescribed order. The distortion detecting section 446 may detect the amplitude and the phase of the each harmonic wave component by normalizing the amplitude of each harmonic wave component with the fundamental wave amplitude (S906).

Here, the prescribed orders may be designated by the user or the like. For example, when the user designates harmonic wave components up to the third order, the distortion detecting section 446 may detect the amplitude and the phase of the fundamental wave component, the second-order harmonic wave component, and the third-order harmonic wave component in the rearranged spectrum. In the present example, regardless of the values of the frequencies of the fundamental wave component and the harmonic wave components, these components are each moved to a certain frequency bin in the rearranged spectrum. Therefore, the distortion detecting section 446 can easily detect the amplitude and the phase of the fundamental wave component and the harmonic wave components by detecting the amplitude and the phase of the spectrum at predetermined frequency bins.

Furthermore, the distortion detecting section may calculate compensation coefficients for amplitude and phase components, based on the detected amplitude and phase (S907). The distortion detecting section 446 may store these distortion compensation coefficients in the memory 44 (S908). As a result of the above process, the non-linear distortion caused by the arbitrary waveform generator 48 can be identified.

The following describes a function of the signal compensating section 460 when compensating for the non-linear distortion in the analog signal output by the arbitrary waveform generator 48. The signal compensating section 460 generates a digital signal (pre-distortion signal) in which the non-linear distortion caused by the arbitrary waveform generator 48 is compensated for in advance, based on the compensation coefficients calculated for the non-linear distortion of the arbitrary waveform generator 48 identified in advance by the distortion identifying section 440 based on the reference digital signal.

More specifically, the signal compensating section 460 reads from the memory 44 the waveform data of the digital signal output to the arbitrary waveform generator 48, and then generates an analytic signal by converting the digital signal into a complex-valued signal. For example, the analytic signal generating section 470 may generate an analytic signal that has the digital signal as the real part and has, as the imaginary part, a signal obtained by shifting the phase of the digital signal by 90 degrees. The analytic signal generating section 470 may generate the analytic signal by generating the Hilbert transform pair of the digital signal.

The following describes the compensation process of the arbitrary waveform generator 48 using the flow chart shown in FIG. 6. First, the target data converting section 472 calculates the DC component included in the digital signal and stores the calculated value in the memory 44. The target data converting section 472 removes the DC component from the digital signal (S601). The target data converting section 472 rearranges each frequency component in the pre-compensated spectrum such that (i) the fundamental wave component and the harmonic wave components of the digital signal are in the first Nyquist region of the pre-compensated spectrum and (ii) the image components of the fundamental wave component and the harmonic wave components are in the second Nyquist region of the pre-compensated spectrum (S602). The process performed by the target data converting section 472 may convert the frequencies by rearranging the data of the digital signal along the time axis. Instead, the process performed by the target data converting section 472 may be the same as the process performed by the reference data converting section 444.

The target spectrum calculating section 474 performs a Fourier transform on the digital signal to calculate the pre-compensated spectrum of the digital signal (S603). The band limiting section 476 eliminates the frequency components in the second Nyquist region from the pre-compensated spectrum in which the frequency components have been rearranged by the target data converting section 472 (S604). The inverse Fourier transform section 478 performs an inverse Fourier transform on the pre-compensated spectrum output by the band limiting section 476. The target data converting section 472 gathers the fundamental wave component and the harmonic wave components of the digital signal in the first Nyquist region of the pre-compensated spectrum, and gathers the image components of the fundamental wave component and the harmonic wave components in the second Nyquist region of the pre-compensated spectrum. Therefore, the analytic signal can be easily generated by eliminating the frequency components in the second Nyquist region and performing an inverse Fourier transform (S605).

The phase compensating section 492 compensates the phase of the analytic signal generated by the analytic signal generating section 470, based on the compensation coefficients of the arbitrary waveform generator 48 stored in the memory. The exponentiating section 482 generates exponentiated signals obtained by raising the analytic signal to a power equal to the order of a corresponding harmonic wave component from among the harmonic wave components having the prescribed orders in the digital signal. For example, when compensating for the non-linear distortion caused by harmonic wave components up to the third order, the exponentiating section 482 generates (i) an exponentiated signal obtained by raising to the second power the analytic signal whose phase is shifted by $\theta_2$ and (ii) an exponentiated signal obtained by raising to the third power the analytic signal whose phase is shifted by $\theta_3$.

The coefficient multiplying section 484 generates compensation signals by multiplying (i) each exponentiated signal generated by the exponentiating section 482 by (ii) the compensation coefficient corresponding to the amplitude component of the non-linear distortion caused by each harmonic wave component and identified by the distortion detecting section 446. For example, when compensating for the non-linear distortion caused by harmonic wave components up to the third order, the coefficient multiplying section 484 multiplies the compensation coefficient corresponding to the second-order harmonic wave component calculated by the distortion detecting section 446 by the analytic signal raised to the second power, and multiplies the compensation coefficient corresponding to the third-order harmonic wave component by the analytic signal raised to the third power.

The compensating section 490 compensates in advance for the non-linear distortion that occurs when the arbitrary waveform generator 48 performs the analog conversion on the digital signal by subtracting, from the digital signal generated based on the waveform data read from the memory 44, each compensation signal generated by the coefficient multiplying section 484. The compensating section 490 may subtract the real part of each compensation signal from the digital signal (S606).

The inverse data converting section 494 rearranges each frequency component in the compensated spectrum such that the frequency of each component in the compensated spectrum of the digital signal output by the compensating section 490 returns to the original frequency of the component prior to being moved by the target data converting section 472. Each frequency component may be rearranged by rearranging the data points on the time axis, or by rearranging the spectrum on the frequency axis (S607). Finally, after reading the value of the DC component stored in the memory 44 at step S601, the inverse data converting section 494 subtracts the amplitude value of the second-order harmonic wave component from the read value (S608). The inverse data converting section 494 adds the resulting value to the compensated signal, and attaches the DC component included in the pre-compensated signal to the compensated signal. After this step, the compensation process for the arbitrary waveform generator 48 is finished.

The signal output control section 450 outputs to the arbitrary waveform generator 48 the compensated digital signal acquired from the inverse data converting section 494. This digital signal includes a component that cancels out the non-linear distortion in the analog signal in the arbitrary waveform generator 48, and so the arbitrary waveform generator 48 outputs an analog signal that does not include non-linear distortion.

Figure 10:
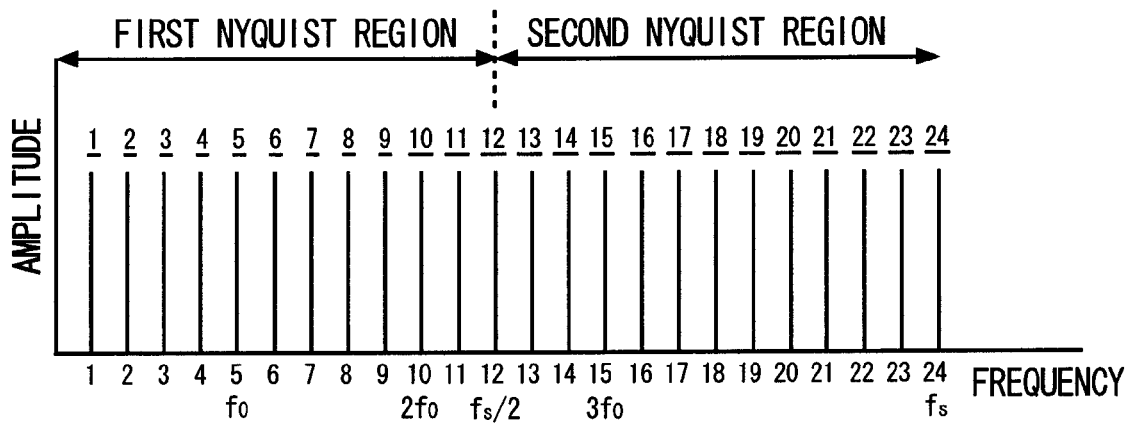
FIG. 10 shows an exemplary frequency spectrum before rearrangement.
Figure 11:
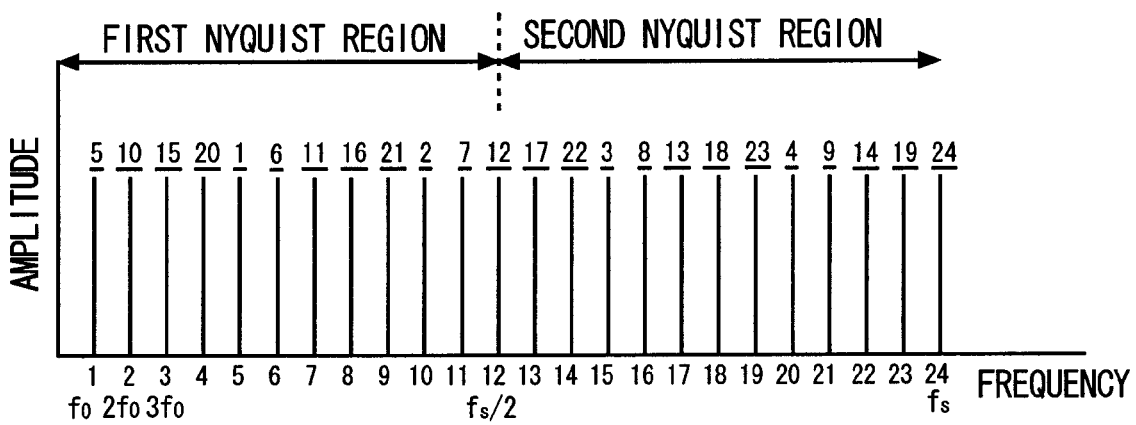
FIG. 11 shows an exemplary frequency spectrum after rearrangement.

FIGS. 10 and 11 show detailed examples of the frequency spectrum rearranging processes performed at steps S303. S803, and S904. FIG. 10 shows a frequency spectrum before the data of the frequency spectrum is rearranged. In FIG. 10, the numerals 1 to 24 indicate numbers of frequency bins used when performing the FFT. The underlined numerals 1 to 24 indicate numbers of frequency spectra. Frequency bins number 5, 10, and 15 correspond respectively to the fundamental frequency $f_0$, the second-order harmonic wave frequency $2f_0$, and the third-order harmonic wave frequency $3f_0$.

For example, to move the fundamental frequency to, the second-order harmonic wave $2f_0$, and the third-order harmonic wave frequency $3f_0$ into the first Nyquist region, the reference data converting section 444 may set (i) the frequency component at each frequency bin number that is k-times the frequency bin number of the fundamental wave component of the spectrum calculated by the reference spectrum calculating section 442 to be (ii) the frequency component at the k-th frequency bin in the spectrum whose data has been rearranged. If k-times the frequency bin number of the fundamental wave component results in a frequency bin number greater than the maximum frequency bin number L in the spectrum, the reference data converting section 444 may set (i) the frequency component of a frequency bin corresponding to a value calculated by subtracting a value corresponding to the maximum frequency bin number from k-times the frequency bin number of the fundamental wave component as (ii) as the frequency component at the k-th frequency bin in the spectrum whose data has been rearranged. For example, if the frequency bin numbers in the spectrum are from 0 to N−1, the reference data converting section 444 may use N as the value being subtracted.

In the present example, the reference data converting section 444 may perform the rearrangement as described below. The reference data converting section 444 calculates an integer m using the equation m=5×i (modulo N), where i is a rearranged frequency bin number. Here, N represents the total number of data points being analyzed. Next, the reference data converting section 444 completes the rearrangement by allocating to the rearranged frequency bin number i the frequency of the pre-rearranged frequency bin number m.

FIG. 11 shows a frequency spectrum after the data of the frequency spectrum is rearranged. In FIG. 11, the fundamental frequency ti), which was at the fifth frequency bin prior to the rearrangement, is now at the first frequency bin after the rearrangement. In the same way, the second-order harmonic wave frequency $2f_0$, which was at the tenth frequency bin prior to the rearrangement, is now at the second frequency bin after the rearrangement, and the third-order harmonic wave frequency $3f_0$, which was at the fifteenth frequency bin prior to the rearrangement, is now at the third frequency bin after the rearrangement. As a result, the fundamental wave, the second-order harmonic wave, and the third-order harmonic wave are within the first Nyquist region. Furthermore, the image components of the fundamental wave and the harmonic waves (k=19, 14, 9) are in the second Nyquist region.

The inverse data converting section 494 may perform an inverse of the rearrangement process described in relation to FIGS. 10 and 11. For example, the inverse data converting section 494 may multiply the frequency bin number m of the fundamental frequency $f_0$ by each frequency bin number in the spectrum of the signal in which the non-linear distortion has been compensated for. The target data converting section 472 may notify the inverse data converting section 494 concerning the frequency bin number of the fundamental frequency $f_0$.

The inverse data converting section 494 may subtract an integer multiple of L from the computation result of components whose computation results indicate a value greater than the maximum frequency bin number L in the spectrum, such that the computation result indicates a value no less than 1 and no greater than L. The inverse data converting section 494 then moves the component at each frequency bin to the frequency bin number obtained from the above computation. In this way, the inverse data converting section 494 can rearrange each frequency component in the compensated spectrum such that each frequency component in the compensated spectrum returns to the original frequency prior to the movement by the target data converting section 472.

Figure 12:
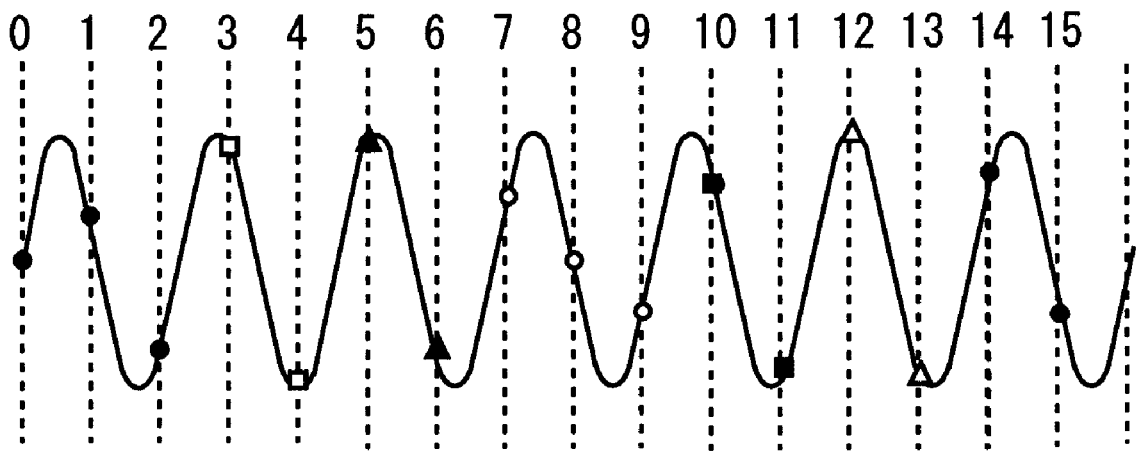
FIG. 12 shows a sinusoidal waveform before frequency conversion.
Figure 13:
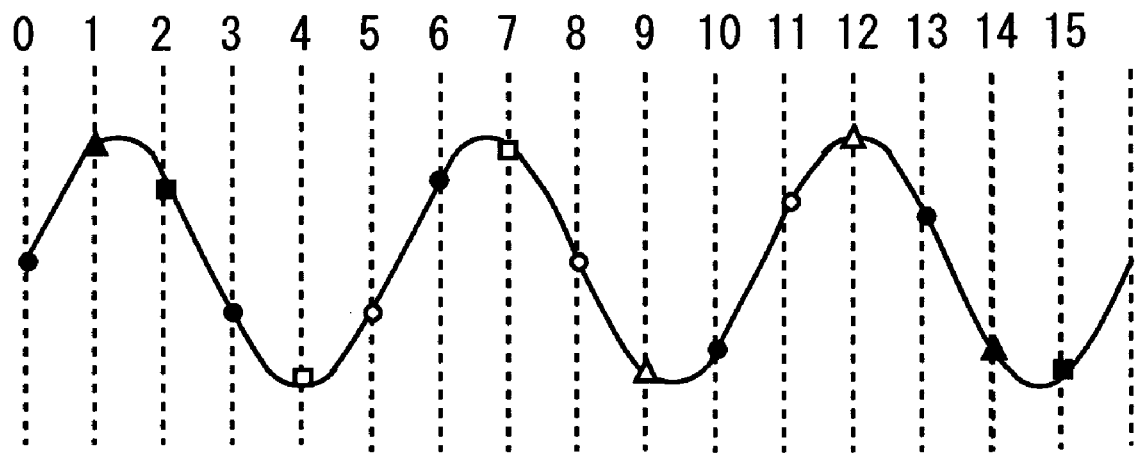
FIG. 13 shows a sinusoidal waveform after frequency conversion.

FIGS. 12 and 13 show an example of the process for rearranging the frequency bins according to a computation on the time axis, as described in step S602. The target data converting section 472 samples 7 cycles of a sinusoidal wave at 16 points, as shown in FIG. 12. Next, the target data converting section 472 generates 3 cycles of a sinusoidal wave by rearranging the sampled data as shown in FIG. 13. As a result, the target data converting section 472 can convert the frequency while maintaining the amplitude and phase of the waveform.

For example, if the measured signal has K cycles, the rearranged waveform has K' cycles, and the number of measured signal points is N, the reference data converting section 444 moves the (K'×i mod·N)-th data point to be the (K×i mod·N)-th data point. In the example of FIG. 12, K=7, K'=3, and N=16. Accordingly, the third sampled data point is moved to be the seventh data point.

In the same manner as described in relation to FIGS. 10 and 11, the inverse data converting section 494 may perform an inverse of the rearrangement process on the corrected signal in which the frequency bins have been rearranged according to a computation on the time axis. In other words, the inverse data converting section 494 may move the (K×i mod·N)-th data point to be the (K'×i mod·N)-th data point for each sampled data point in the corrected signal.

Figure 14:
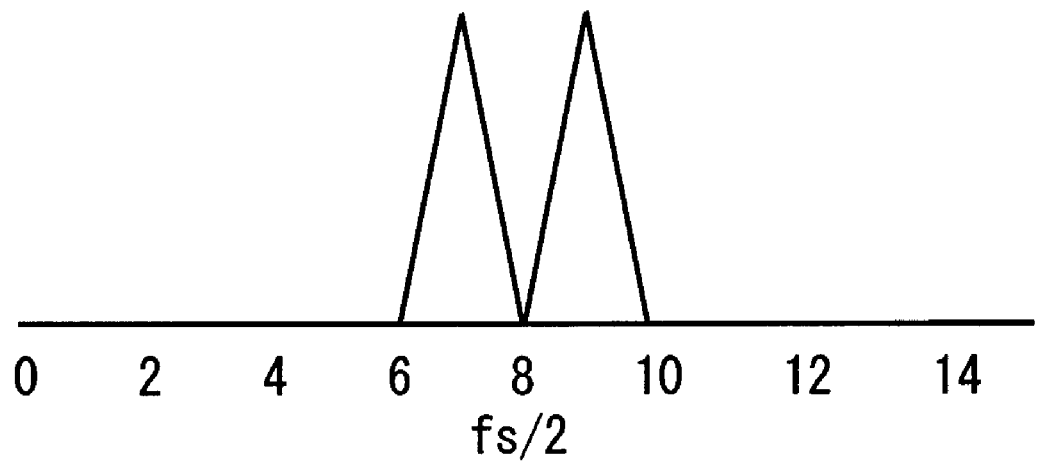
FIG. 14 shows a frequency characteristic of a sinusoidal wave before frequency conversion.
Figure 15:
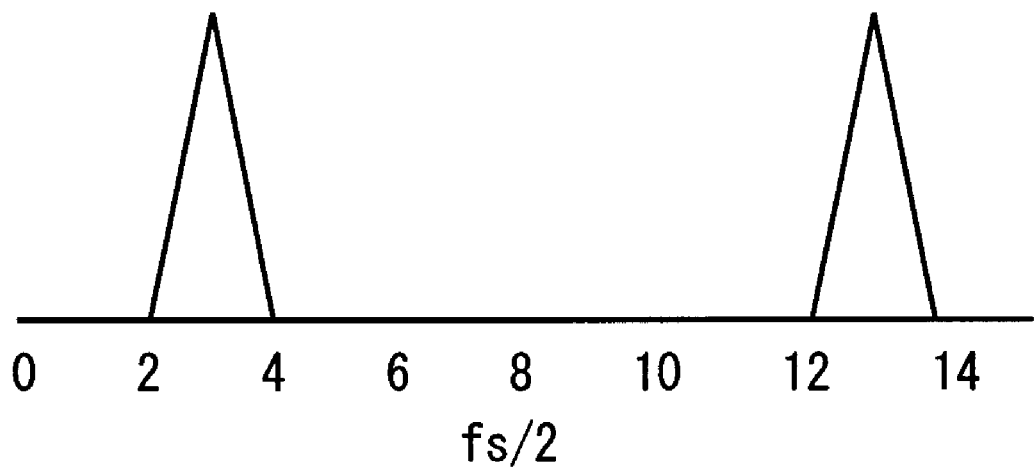
FIG. 15 shows a frequency characteristic of a sinusoidal wave after frequency conversion.

FIGS. 14 and 15 show a schematic view of a frequency spectrum before and after the frequency bin rearrangement process is performed. FIG. 14 shows a spectrum having the waveform shown in FIG. 12, and FIG. 15 shows a spectrum having the waveform shown in FIG. 13. The frequency component at frequency 7 in FIG. 14 is understood to be moved to frequency 3 in FIG. 15. Frequency 9 in FIG. 14 and frequency 13 in FIG. 15 represent the image frequency components.

Figure 16:
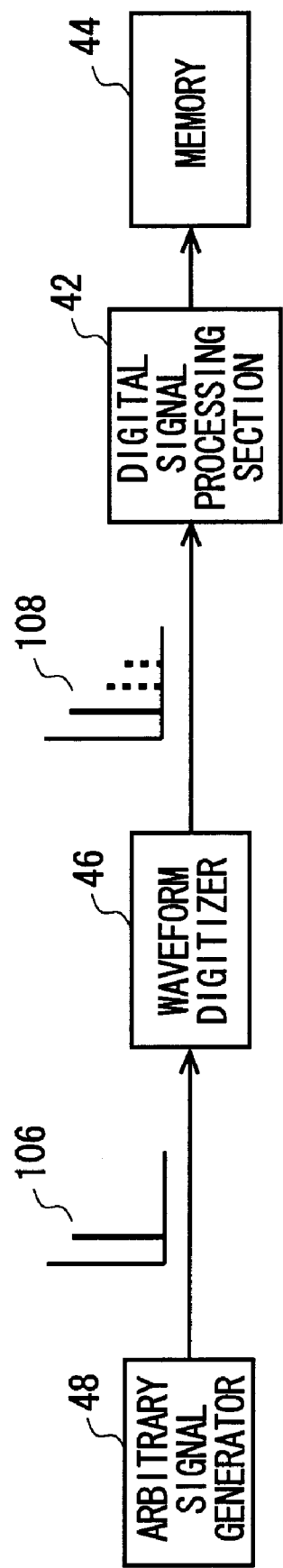
FIG. 16 is a schematic view of the identification process for the waveform digitizer.

The following describes the basics of the identification process and compensation process. FIG. 16 is a schematic view of the identification process for generating a compensation coefficient of the waveform digitizer 46. When performing the identification process for the waveform digitizer 46, the arbitrary waveform generator 48 outputs an analog signal 106 obtained by performing an analog conversion on a reference digital signal received from the digital signal processing section 42. The reference analog signal 106 desirably includes a single frequency.

The waveform digitizer 46 receives the reference analog signal 106 and converts this signal into a reference digital signal 108. When the waveform digitizer 46 performs the digital conversion, the amplitude and phase of the frequency component of the reference analog signal 106 change, and so the reference digital signal 108 output by the waveform digitizer 46 has harmonic waves, shown by dotted lines, added thereto.

The digital signal processing section 42 analyzes the difference between the reference digital signal 108 and the digital signal used to generate the reference analog signal 106, and acquires the amplitude component and the phase component of the distortion component. The digital signal processing section 42 calculates distortion compensation coefficients using the information about the acquired amplitude and phase, and stores the distortion compensation coefficients in the memory 44.

Figure 17:
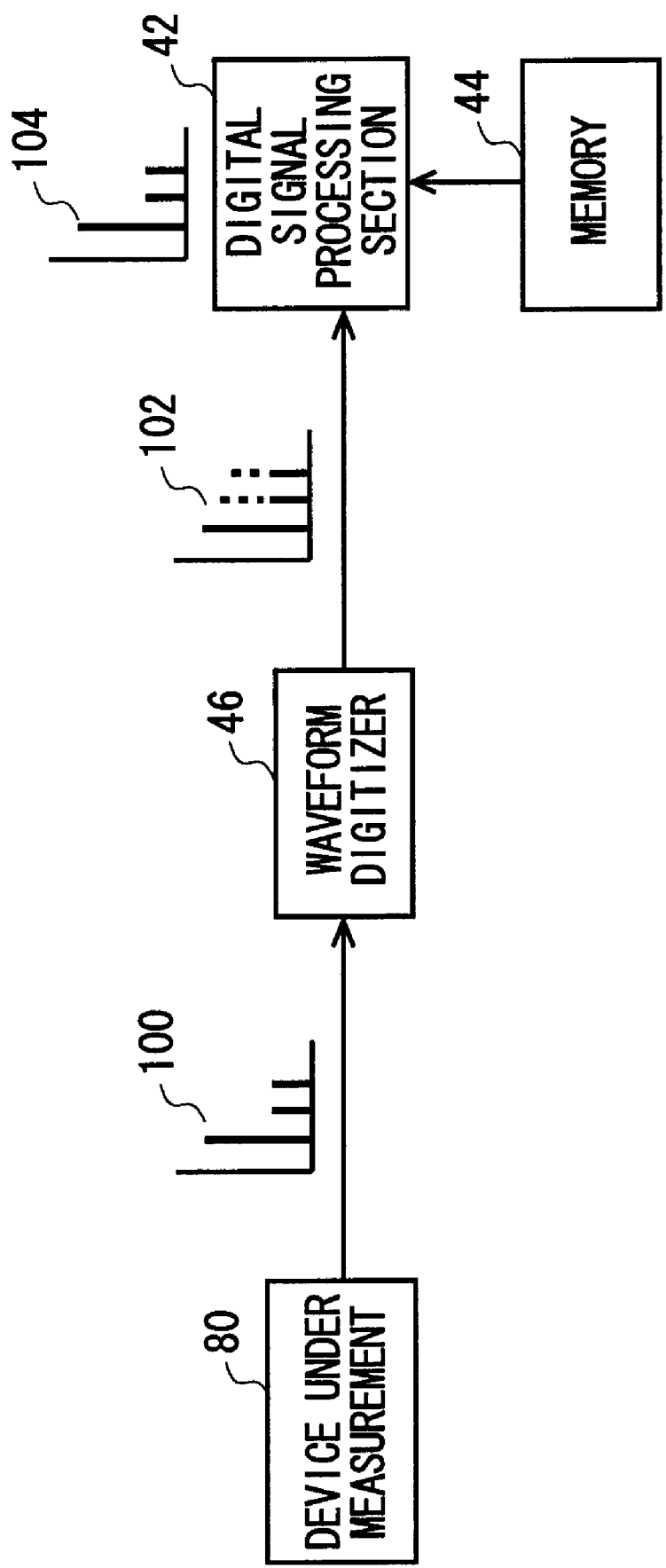
FIG. 17 is a schematic view of the compensation process for the waveform digitizer.

FIG. 17 shows the basics of compensating for distortion of the waveform digitizer 46. First, the device under test 80 outputs an analog signal 100 from the output terminal. The waveform digitizer 46 performs a digital conversion on the received analog signal 100. When the waveform digitizer 46 performs the digital conversion, the amplitude and the phase of the frequency component of the analog signal 100 changes, and so the digital signal 102 output by the waveform digitizer 46 has harmonic waves, shown by dotted lines, added thereto.

The digital signal processing section 42 receives the digital signal 102 having distortion caused by the waveform digitizer 46. The digital signal processing section 42 compensates for the distortion component in the digital signal 102 by using the distortion compensation coefficients calculated in advance for the waveform digitizer 46. As a result, the digital signal processing section 42 can generate the digital signal 104 having characteristics substantially equal to those of the analog signal 100.

Figure 18:
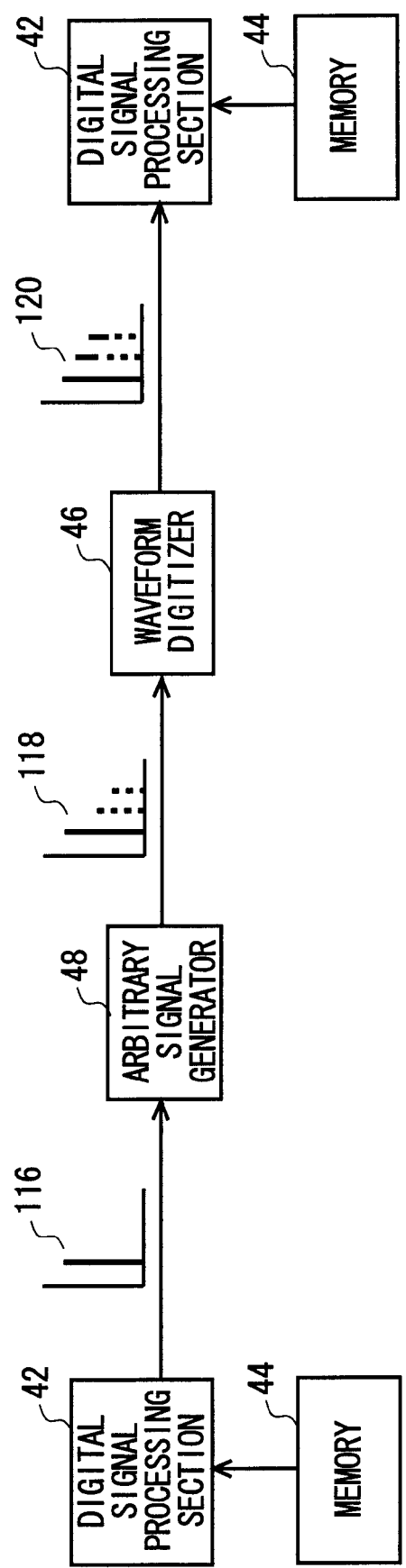
FIG. 18 is a schematic view of the identification process for the arbitrary waveform generator.

The following describes a method of compensating for the distortion of the arbitrary waveform generator 48. FIG. 18 is a schematic view of the process for generating the compensation coefficients that compensate for the distortion of the arbitrary waveform generator 48. The digital signal processing section 42 reads from the memory 44 the waveform data of the prescribed frequency, and outputs the reference digital signal 116 to the arbitrary waveform generator 48. The arbitrary waveform generator 48 generates the reference analog signal 118 by performing an analog conversion on the reference digital signal 116, and outputs the reference analog signal 118 to the waveform digitizer 46. The reference analog signal 118 includes harmonic waves, shown by dotted lines, due to the non-linear distortion caused by the analog circuits in the arbitrary waveform generator 48.

The waveform digitizer 46 generates the reference digital signal 120 onto which the distortion of the reference analog signal 118 is superimposed due to the effect of the analog circuits in the waveform digitizer 46. If the identification process has already been performed for the waveform digitizer 46, the digital signal processing section 42 can read from the memory 44 the distortion compensation coefficients of the waveform digitizer 46. The digital signal processing section 42 performs the distortion compensation process on the reference digital signal 120 using the read compensation coefficients to recreate a signal that is substantially the same as the reference analog signal 118. In the recreated signal, the distortion component of the arbitrary waveform generator 48 is added to the waveform input to the arbitrary waveform generator 48. Accordingly, the digital signal processing section 42 can calculate the compensation coefficients based on the difference between the signal that has undergone the distortion compensation process of the reference digital signal 120 and the reference digital signal 116 input to the arbitrary waveform generator 48.

Figure 19:
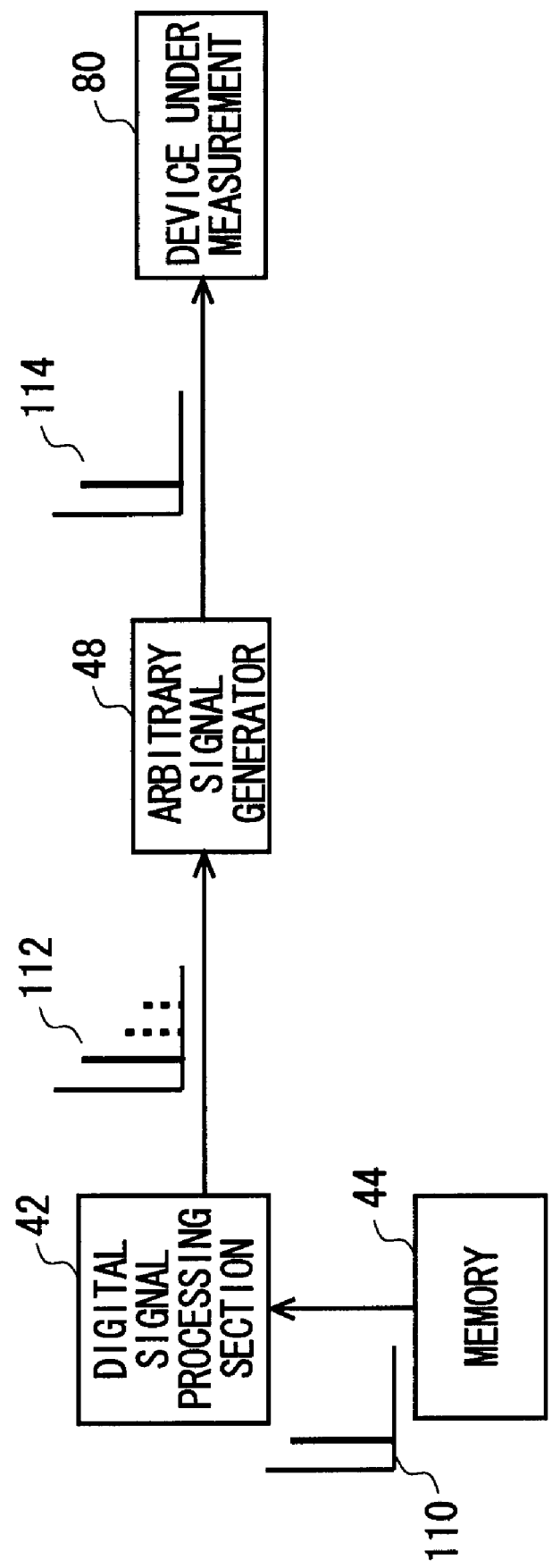
FIG. 19 is a schematic view of the compensation process for the arbitrary waveform generator.

FIG. 19 shows the general process for measuring the device under test 80 in a state where the distortion of the arbitrary waveform generator 48 is compensated for. The digital signal processing section 42 reads from the memory 44 the waveform data 110 used for measuring the device under test 80. Furthermore, the digital signal processing section 42 reads from the memory 44 the compensation coefficients for correcting the distortion caused by the arbitrary waveform generator 48. The digital signal processing section 42 uses the read compensation coefficients to generate the measured digital signal 112 obtained by adding distortion in advance to the waveform data 110, and sends the measured digital signal 112 to the arbitrary waveform generator 48.

In the arbitrary waveform generator 48, the distortion occurs in the measured digital signal 112 due to the non-linear characteristic of the analog circuit therein. Distortion that cancels out the distortion of the arbitrary waveform generator 48 is added in advance to the measured digital signal 112. Accordingly, due to the distortion caused by the arbitrary waveform generator 48, the measured analog signal 114 output by the arbitrary waveform generator 48 substantially matches the signal that would be obtained by an ideal analog circuit performing an analog conversion on the waveform data 110 read from the memory 44 by the digital signal processing section 42.

Figure 20:
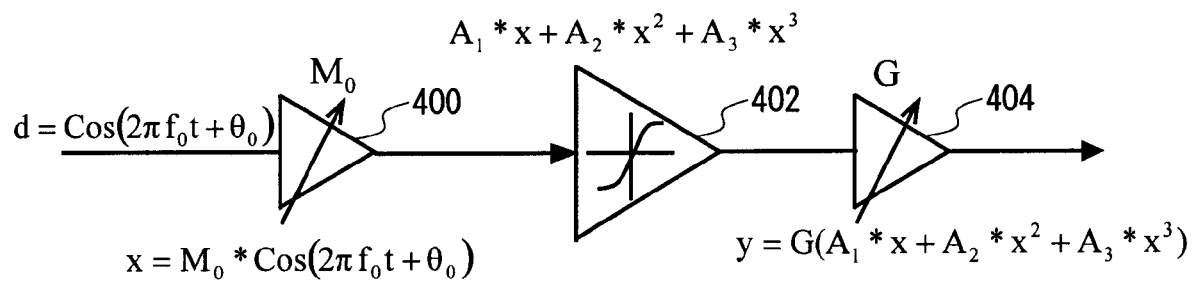
FIG. 20 shows a generation model of non-linear distortion.

The following is a detailed description of an identification algorithm and a compensation algorithm. FIG. 20 shows a generation model of non-linear distortion. The input signal in this model has a frequency of $f_0$ and phase $\theta_0$, and is expressed as $d = \cos(2\pi f_0 t + \theta_0)$. Since the analog circuit 400 has a gain of $M_0$, the analog circuit 400 outputs a signal $x = M_0 \times \cos(2\pi f_0 t + \theta_0)$ to the analog circuit 402. The analog circuit 402 causes non-linear distortion in the input signal, resulting in a signal expressed as shown below.

$$x' = A_1 * x + A_2 * x^2 + A_3 * x^3$$

The analog circuit 402 outputs this signal to the analog circuit 404 at a later stage. The above expression is an example of distortion up to the third order, but $A_n$ may be added for each component greater than the third order. The analog circuit 404 has a gain G, and therefore outputs the signal shown in Expression 1 below.

$$y = G(A_1 * x + A_2 * x^2 + A_3 * x^3) \quad (1)$$

Here, it is assumed that the dynamics of the linear characteristic are low and can be approximated by a polynomial expression.

Figure 21:
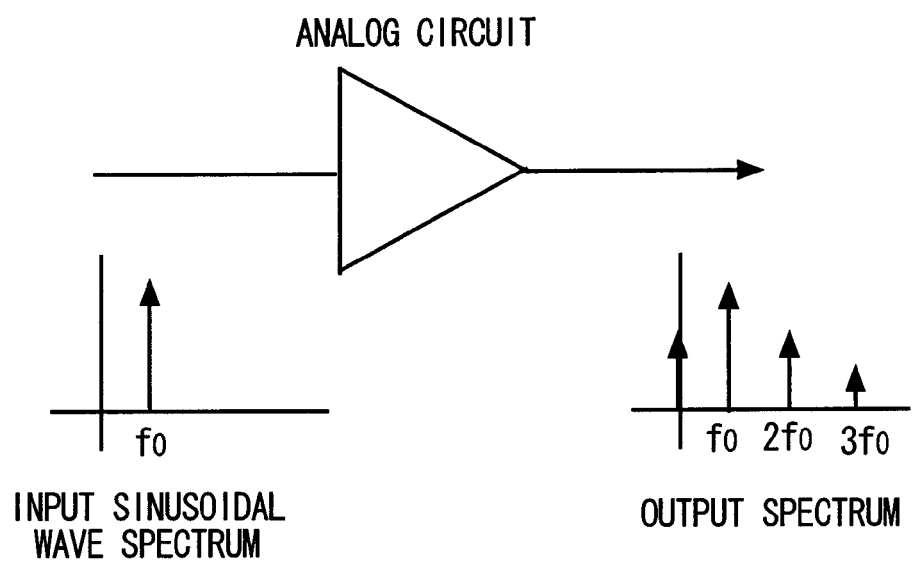
FIG. 21 is a schematic diagram of a frequency characteristic of a third-order polynomial approximation model of a non-linear characteristic.
Figure 22:
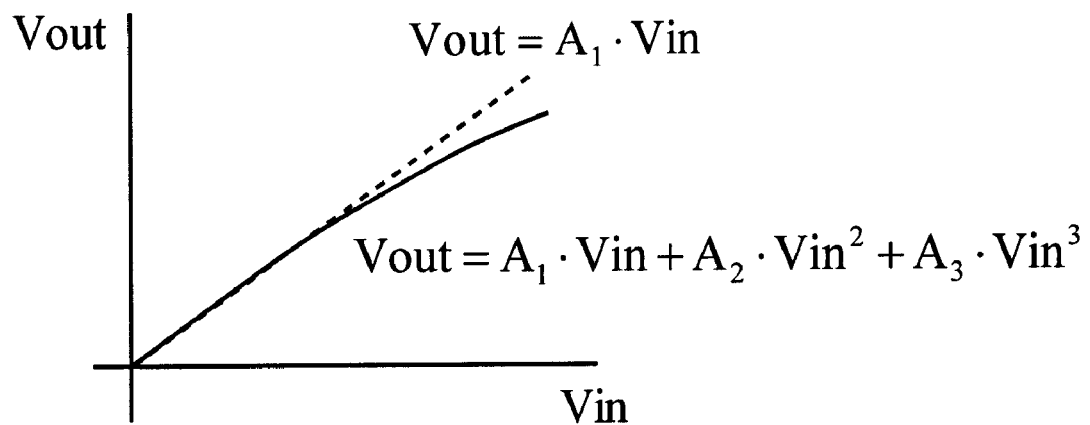
FIG. 22 is a schematic diagram of an amplitude characteristic of a third-order polynomial approximation model of a non-linear characteristic.

FIG. 21 is a schematic diagram of a frequency characteristic of a third-order polynomial approximation model of a non-linear characteristic. FIG. 22 is a schematic diagram of an amplitude characteristic of a third-order polynomial approximation model of a non-linear characteristic. When the amplitude of a sinusoidal wave having non-linear distortion is approximated by the third-order polynomial of Expression 1, the output spectrum when this sinusoidal wave is input to the analog circuit includes a DC component, a fundamental wave component, a second-order harmonic wave component, and a third-order harmonic wave component, as shown in FIG. 21. When Vin represents the voltage of the input sinusoidal wave and Vout represents the voltage output from the analog circuit having a gain $A_1$, Vin and Vout have an ideal linear relationship shown by the dotted line of FIG. 22. However, when the analog circuit causes non-linear distortion, the output voltage is represented by Expression 2, where Vin and Vout have the non-linear relationship shown by the solid line.

$$V_{out} = A_1 * V_{in} + A_2 * V_{in}^2 + A_3 * V_{in}^3 \quad (2)$$

Here, if the input voltage of the analog circuit 402 is represented by Expression 3, the output voltage of the analog circuit 402 for non-linear distortion up to the n-th order can be expressed by Expression 4.

$$V\mathrm{in}(t) = M_0 * \mathrm{Cos}(2\pi f_0 t + \theta_0) \quad (3)$$

$$Vout(t) = \sum_{i=1}^{n} |A_i| * (M_0 * \mathrm{Cos}(2\pi f_0 t + \theta_0 + \varphi_i))^i \quad (4)$$

With n being set equal to 3 in Expression 4, this Expression is substituted into Expression 2 and expanded.

$$Vout(t) = \sum_{i=1}^{3} |A_i| * (M_0 * \mathrm{Cos}(2\pi f_0 t + \theta_0 + \varphi_i))^i \quad (5)$$

$$= \frac{M_0^2 \cdot A_2}{2}$$

$$+ M_0 \cdot |A_1| \cdot \left( \mathrm{Cos}(2\pi f_0 t + \theta_0) + \frac{3}{4} M_0^2 \cdot \frac{|A_3|}{|A_1|} \cdot \mathrm{Cos}(2\pi f_0 t + \theta_0 + \angle A_3) \right) \quad (6)$$

$$+ \frac{M_0^2 \cdot |A_2|}{2} \cdot \mathrm{Cos}(2\pi \cdot 2 f_0 t + 2\theta_0 + 2\angle A_2) \quad (7)$$

$$+ \frac{M_0^3 \cdot |A_3|}{4} \cdot \mathrm{Cos}(2\pi \cdot 3 f_0 t + 3\theta_0 + 3\angle A_3) \quad (8)$$

Here, Expression 5 represents the DC component, Expression 6 represents the fundamental frequency component, Expression 7 represents the second-order harmonic frequency component, and Expression 8 represents the third-order harmonic frequency component.

Figure 23:
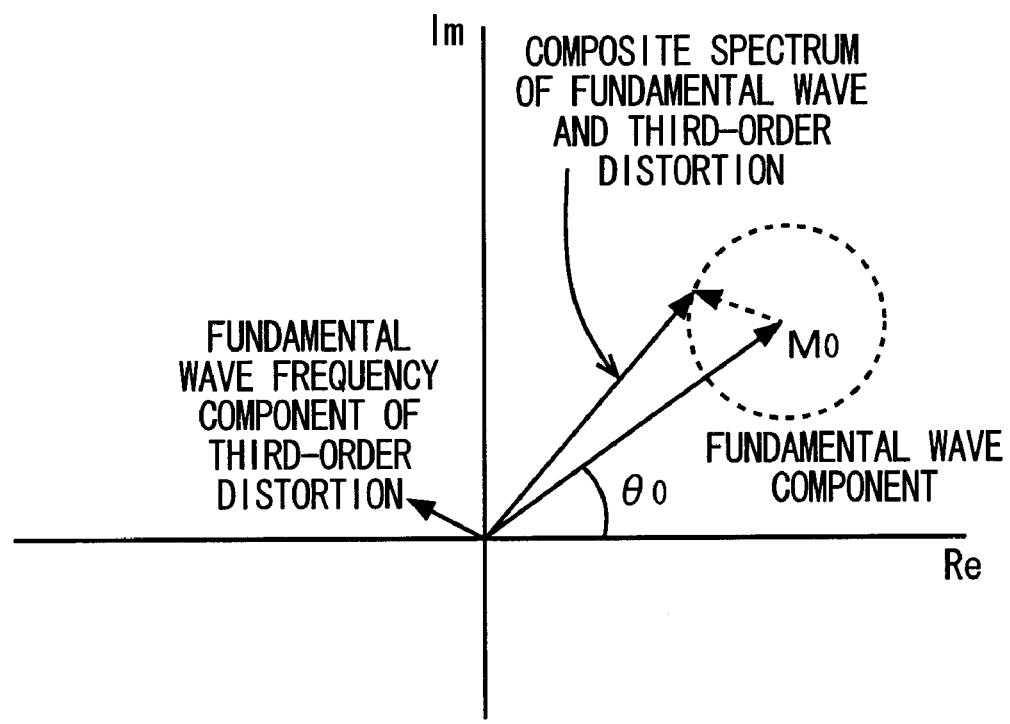
FIG. 23 shows the effect of the third-order harmonic wave distortion on the fundamental wave component.

In Expression 6, the third-order harmonic wave is added to the fundamental wave. FIG. 23 is a schematic diagram showing a composite spectrum of a composite wave obtained by adding the third-order harmonic wave to the fundamental wave. The origin is the starting point, the fundamental wave component has a phase of $\theta_0$ with respect to the horizontal axis, and the length of the arrow corresponds to amplitude. The arrow with a dotted line, which begins at the end of the fundamental wave component arrow, represents the third-order harmonic wave component. The end point of the third-order harmonic wave component arrow moves along the circle shown by the dotted line, according to the phase of the third-order harmonic wave. The arrow connecting the origin and the end point of the third-order harmonic wave component arrow represents the composite wave component.

Here, if the length of the vector corresponding to the third-order distortion is assumed to be sufficiently small, then Expression 6 can be approximated as shown below.

$$\left( M_0 \cdot |A_1| \cdot \mathrm{Cos}(2\pi f_0 t + \theta_0) + \frac{3}{4} M_0^3 \cdot |A_3| \cdot \mathrm{Cos}(2\pi f_0 t + \theta_0 + \angle A_3) \right) \cong$$

$$\left( M_0 \cdot |A_1| \cdot \mathrm{Cos}(2\pi f_0 t + \theta_0) + \frac{3}{4} M_0^3 \cdot |A_3| \cdot \mathrm{Cos}(2\pi f_0 t + \theta_0) \right)$$

Figure 24:
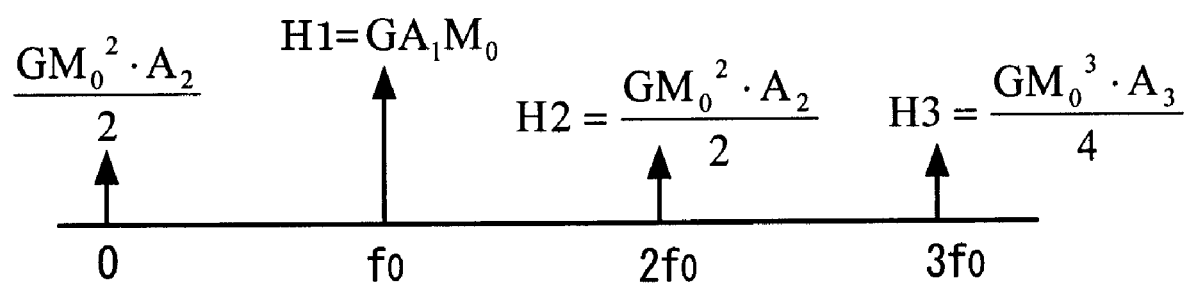
FIG. 24 shows an exemplary frequency spectrum of the harmonic wave distortion component.

In other words, the phase of the fundamental wave can be approximated as being substantially equal to the phase of each harmonic wave with a group delay. Furthermore, if the third-order distortion component is sufficiently small, the effect of the alias of the third-order distortion on the fundamental wave may be ignored. FIG. 24 shows a frequency spectrum calculated by the above approximation. When the fundamental wave amplitude $H_1$ of the input signal is equal to $GM_0 \cdot A_1$, the amplitudes of the DC component, the second-order harmonic wave component, and the third-order harmonic wave component can be expressed as shown below.

$$H_0 = \frac{GM_0^2 \cdot A_2}{2}, \quad H_2 = \frac{GM_0^2 \cdot A_2}{2}, \quad H_3 = \frac{GM_0^3 \cdot A_3}{4},$$

The following describes a method for generating the distortion compensation coefficients using the approximated amplitudes $H_1$, $H_2$, and $H_3$. In Expression 1, the distortion component is $GA_2 \times x^2 + GA_3 \times x^3$, and so if the following is generated for the signal y output by the waveform digitizer 46, the distortion can be compensated for.

$$\tilde{y} = y - GA_2 * x^2 + GA_3 * x^3 \quad (9)$$

The digital signal processing section 42 can know the signal y output by the waveform digitizer 46, but cannot know the signal x input to the waveform digitizer 46. Therefore, Expression 9 is expanded to achieve the Expressions below.

$$\tilde{y} = GA_1 \cdot x \quad (10)$$

$$= y - GA_2 * x^2 + GA_3 * x^3$$

$$= y - \frac{A_2}{GA_1^2} \cdot (GA_1 x)^2 - \frac{A_3}{G^2 A_1^3} \cdot (GA_1 x)^3$$

$$\approx y - \frac{A_2}{GA_1^2} \cdot y^2 - \frac{A_3}{G^2 A_1^3} \cdot y^3 \quad (11)$$

$$= y - \frac{2H_2}{H_1^2} \cdot y^2 - \frac{4H_3}{H_1^3} \cdot y^3 \quad (12)$$

$$= y - \tilde{A}_2 \cdot y^2 - \tilde{A}_3 \cdot y^3 \quad (13)$$

If $A_2$ and $A_3$ are each less than 0.01, Expression 10 can be approximated as Expression 11. Here, $H_1$, $H_2$, and $H_3$ are the respective amplitudes of the fundamental wave component, the second-order harmonic wave component, and the third-order harmonic wave component of the signal y output by the waveform digitizer 46. Accordingly, by analyzing the signal y received from the waveform digitizer 46 and calculating $H_1$, $H_2$, and $H_3$, the following compensation coefficients are obtained.

$$|A_2| = \frac{2|H_2|}{H_1^2}, \quad |A_3| = \frac{4|H_3|}{H_1^3} \qquad (14)$$

$$\angle A_2 = \angle H_2/2, \quad \angle A_3 = \angle H_3/3 \qquad (15)$$

The digital signal processing section 42 may calculate the compensation coefficients by substituting into Expressions 14 and 15 the amplitudes and phases of the fundamental wave spectrum, the second-order harmonic wave spectrum, and the third-order harmonic wave spectrum.

The following describes an algorithm of the identification process for generating the distortion compensation coefficients of the arbitrary waveform generator 48. The distortion caused by the arbitrary waveform generator 48 can be expressed by the non-linear distortion generation model shown in FIG. 20, in the same manner as the distortion caused by the waveform digitizer 46.

According to Expression 1, harmonic wave distortion represented by $GA_2 \times x^2 + GA_3 \times x^3$ is added in the arbitrary waveform generator 48. The digital signal processing section 42 performs a process to add distortion for canceling out the harmonic wave distortion to the waveform generation data input to the arbitrary waveform generator 48. In other words, if the waveform digitizer 46 input to the arbitrary waveform generator 48 is represented by d, the compensated waveform can be expressed as shown below.

$$\tilde{d} = d - (\tilde{A}_2 * d^2 + \tilde{A}_3 * d^3) \qquad (16)$$

When Expression 16 is applied in the model shown in FIG. 20, the compensated waveform can be expanded as shown below.

$$\tilde{x} = M_0 \cdot \tilde{d} \qquad (17)$$
$$= M_0\{d - (\tilde{A}_2 * d^2 + \tilde{A}_3 * d^3)\}$$
$$= M_0 d - \left(A_2 \cdot \frac{M_0^2 * d^2}{A_1} + A_3 \cdot \frac{M_0^3 * d^3}{A_1}\right)$$
$$= x - \left(A_2 \cdot \frac{x^2}{A_1} + A_3 \cdot \frac{x^3}{A_1}\right) \qquad (18)$$

From Expressions 17 and 18, the following Expressions are obtained.

$$\tilde{A}_2 = M_0 \cdot \frac{A_2}{A_1} = \frac{2H_2}{H_1}$$
$$\tilde{A}_3 = M_0^2 \cdot \frac{A_3}{A_1} = \frac{4H_3}{H_1}$$

By normalizing with the amplitude of the fundamental frequency, the compensation coefficients of the arbitrary waveform generator 48 can be expressed as shown below.

$$|A_2| = 2|H_2|, \quad |A_3| = 4|H_3| \qquad (19)$$

$$\angle A_2 = \angle H_2/2, \quad \angle A_3 = \angle H_3/3 \qquad (20)$$

The digital signal processing section 42 may calculate the compensation coefficients by substituting into Expressions 19 and 20 the amplitudes and phases of the second-order harmonic wave spectrum and the third-order harmonic wave spectrum.

The following describes the basics of using the compensation coefficients calculated from the identification to compensate the signals output by the waveform digitizer 46 and the arbitrary waveform generator 48. The semiconductor test apparatus 10 compensates these signals by removing, from the signal output by the waveform digitizer 46 and the signal output by the arbitrary waveform generator 48, the harmonic wave distortion that is expected to be caused in the waveform digitizer 46 and the arbitrary waveform generator 48. In other words, the digital signal processing section 42 calculates the compensated data using Expressions 13 and 16.

More specifically, the digital signal processing section 42 may calculate the following compensated data from the signal y output by the waveform digitizer 46.

$$\tilde{y} = y \cdot \tilde{A}_2 \cdot y^2 - \tilde{A}_3 \cdot y^3 \qquad (21)$$
$$= y - \mathrm{Re}(|A_2| \cdot e^{-j2\theta_0} \cdot H[y]^2 + |A_3| \cdot e^{-j3\theta_0} \cdot H[y]^3)$$
$$= y - \mathrm{Re}(|A_2| \cdot (H[y] \cdot e^{-j\angle A_2})^2 + |A_3| \cdot (H[y] \cdot e^{-j\angle A_3})^3)$$
$$= y - \mathrm{Re}(|A_2| \cdot ((y + j\hat{y}) \cdot e^{-j\angle A_2})^2 + |A_3| \cdot ((y + j\hat{y}) \cdot e^{-j\angle A_3})^3)$$

Here, H[y] is the analytic signal of the signal y calculated using a Hilbert transform.

In the same way, the digital signal processing section 42 may calculate the following compensation data from the signal d output by the arbitrary waveform generator 48.

$$\tilde{d} = d - (\tilde{A}_2 * d^2 + \tilde{A}_3 * d^3) \qquad (22)$$
$$= d - \mathrm{Re}(|A_2| \cdot e^{-j2\theta_0} \cdot H[d]^2 + |A_3| \cdot e^{-j3\theta_0} \cdot H[d]^3)$$
$$= d - \mathrm{Re}(|A_2| \cdot ((d + j\hat{d}) \cdot e^{-j\angle A_2})^2 + |A_3| \cdot ((d + j\hat{d}) \cdot e^{-j\angle A_3})^3)$$

Figure 25:
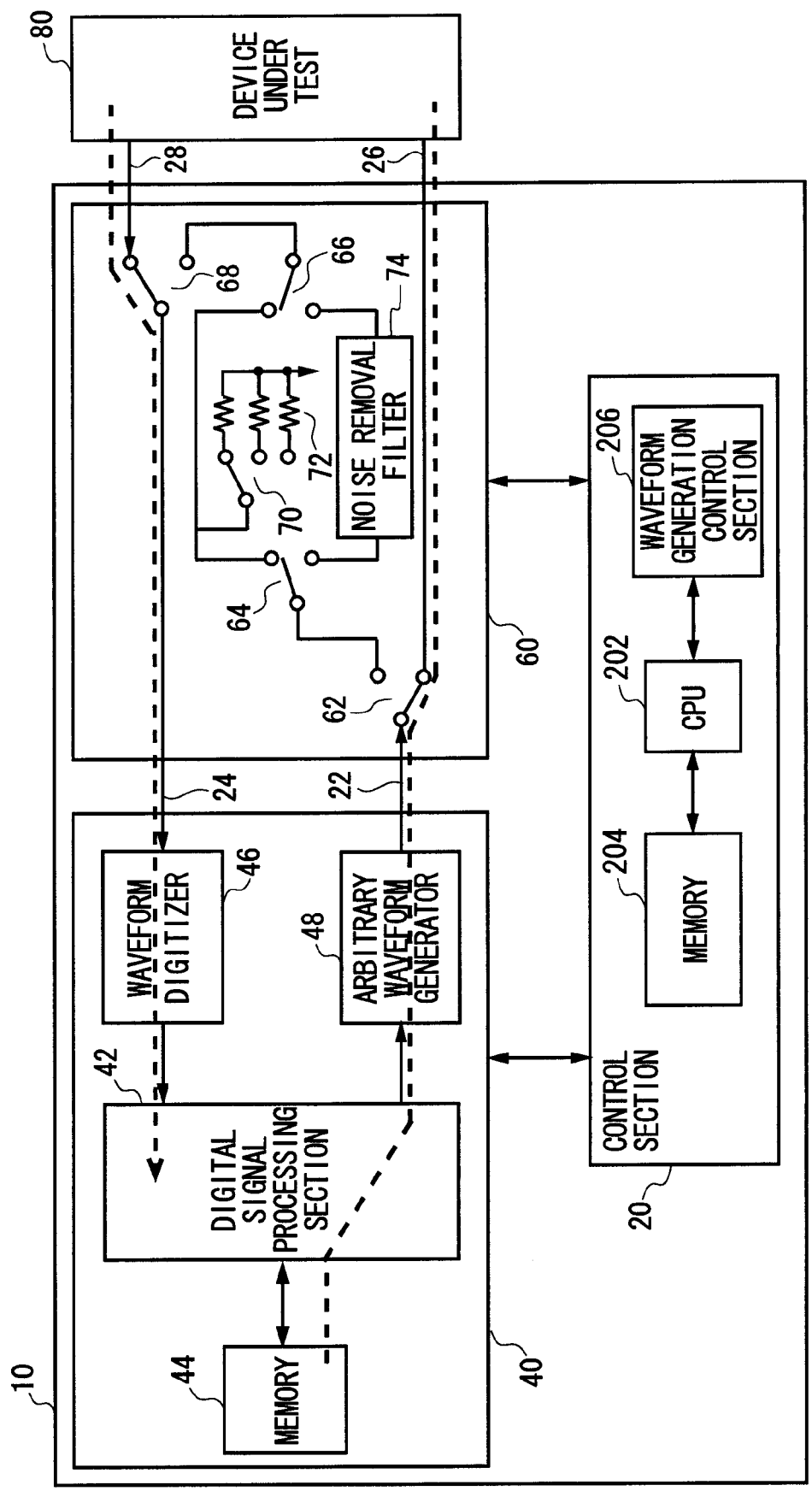
FIG. 25 shows the signal transmission path when testing the device under test.

The following is a description of the signal path used when the semiconductor test apparatus 10 calibrates the waveform digitizer 46 and the arbitrary waveform generator 48. FIG. 25 shows a configuration of the semiconductor test apparatus 10 that includes each functional portion of the path switching section 60. The path switching section 60 includes a loop-back path that is made up of a switch 62, a switch 64, a switch 66, a switch 68, a switch 70 (load switching section), a load 72, and a noise removal filter 74. The path switching section 60 may switch these switches under control of the control section 20, or may switch the signal path between the testing section 40 and the device under test 80 according to the operational mode.

The loop-back path may include a plurality of transmission paths. The first transmission path is formed when calibrating the waveform digitizer 46, and passes the signal output by the arbitrary waveform generator 48 through the noise removal filter 74. The second transmission path is formed when calibrating the arbitrary waveform generator 48, and does not pass the signal output by the arbitrary waveform generator 48 through the noise removal filter 74. The load 72 is provided between the second transmission path and a ground potential. The switch 70 is controlled by the control section 20 to switch whether the load 72 is connected to the second transmission path. A variety of types of loads 72 may be used, and the switch 70 may switch which of the loads is connected to the second transmission path.

The semiconductor test apparatus 10 may be provided with the path switching section 60 in a performance board that is electrically connected to terminal of the device under test 80. Instead, the semiconductor test apparatus 10 may be provided with the path switching section 60 in a calibration board that is used when calibrating the testing section 40. The calibration board may be provided in place of the performance board when calibration is performed.

The dotted line in FIG. 25 indicates the signal path when the semiconductor test apparatus 10 tests the device under test 80. The digital signal processing section 42 receives instructions from the control section 20 and reads from the memory 44 the waveform data and the compensation coefficients of the arbitrary waveform generator 48. The digital signal processing section 42 generates a test digital signal that compensates for the non-linear distortion caused by the arbitrary waveform generator 48, based on the test waveform data and the compensation coefficients, and outputs the test digital signal to the arbitrary waveform generator 48. The arbitrary waveform generator 48 converts the test digital signal into an analog signal, and outputs the analog signal to the path switching section 60. The analog signal input to the path switching section 60 may be output to an input terminal of the device under test 80 via the switch 62.

The device under test 80 outputs an analog signal from the output terminal thereof in response to the analog signal being input to the input terminal thereof. The path switching section 60 outputs the analog signal from the device under test 80 to the waveform digitizer 46 via the switch 68. Upon receiving the digital signal output by the waveform digitizer 46, the digital signal processing section 42 compensates the received digital signal based on the compensation coefficients of the waveform digitizer 46 read from the memory 44. The digital signal processing section 42 analyzes the compensated signal and judges the acceptability of the device under test 80.

Figure 26:
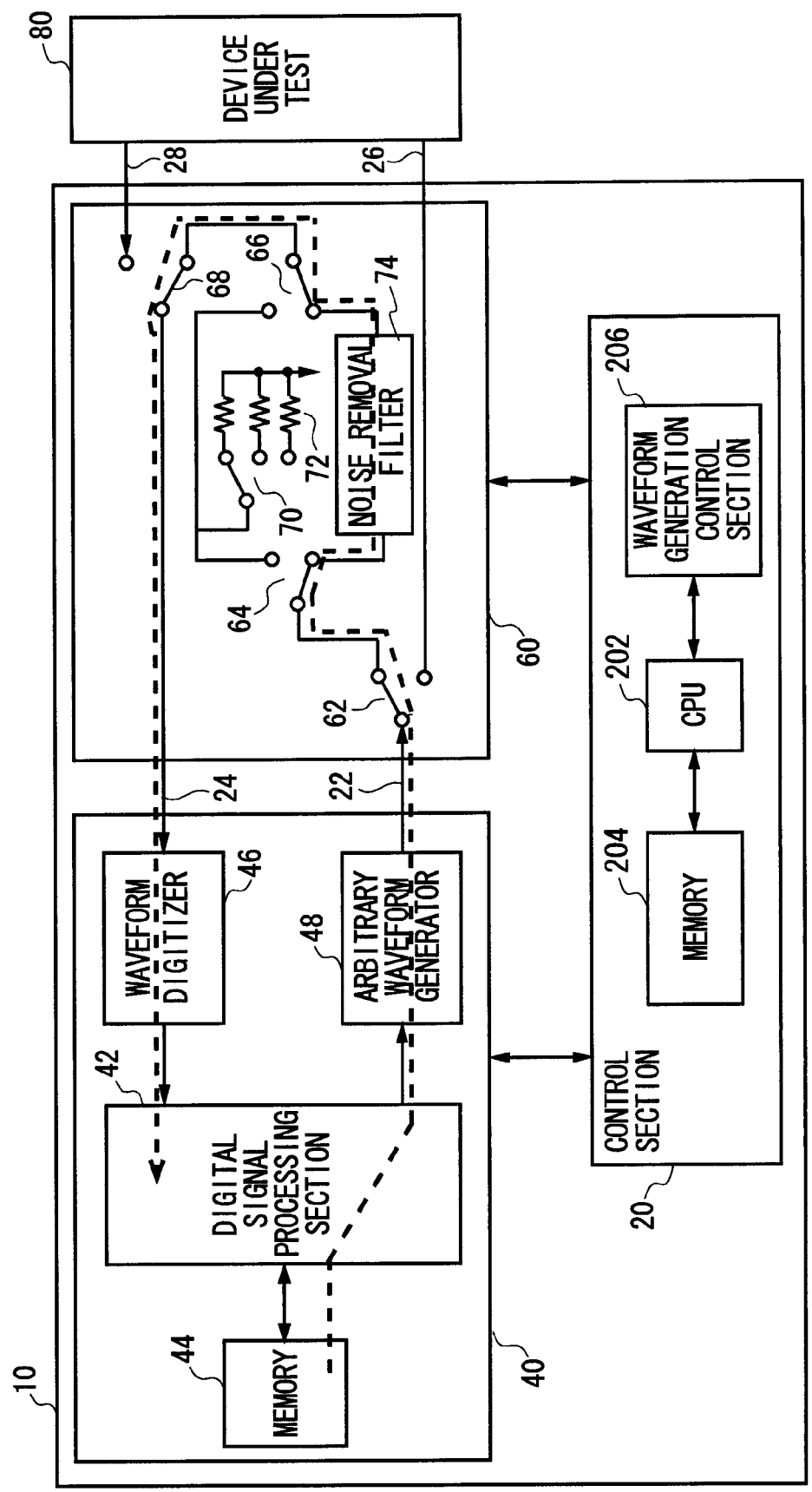
FIG. 26 shows the signal path when performing the identification process for the waveform digitizer.

FIG. 26 shows the signal path when the semiconductor test apparatus performs the identification process for the waveform digitizer 46. When performing the identification process for the waveform digitizer 46, the control section 20 instructs the digital signal processing section 42 to generate an identification signal. The control section 20 switches the switch 62 and the switch 68 in the path switching section 60 to separate the path switching section 60 from the device under test 80. Furthermore, the control section 20 switches the switch 64 and the switch 66 to connect the arbitrary waveform generator 48 and the waveform digitizer 46 via the first transmission path in the loop-back path. In other words, the path switching section 60 outputs the signal from the arbitrary waveform generator 48 to the waveform digitizer 46, through the noise removal filter 74. The noise removal filter 74 may be a low-pass filter that eliminates the harmonic wave noise included in the output signal of the arbitrary waveform generator 48.

The digital signal processing section 42 is controlled by the control section 20 to read the waveform data stored in the memory 44. The digital signal processing section 42 uses the read waveform data to generate a reference digital signal used in the identification process for the waveform digitizer 46, and outputs the reference digital signal to the arbitrary waveform generator 48. The arbitrary waveform generator 48 performs an analog conversion on the reference digital signal to generate the reference analog signal, and outputs the reference analog signal to the path switching section 60. The waveform digitizer 46 receives the reference analog signal via the signal line 22, the switch 62, the switch 64, the noise removal filter 74, the switch 66, and the switch 68. The waveform digitizer 46 performs a digital conversion on the reference analog signal to generate the reference digital signal, and outputs the reference digital signal to the digital signal processing section 42. The digital signal processing section 42 performs the identification process for the waveform digitizer 46 based on the received reference digital signal. The digital signal processing section 42 may store the distortion compensation coefficients calculated for the waveform digitizer 46 in the memory 44.

Figure 27:
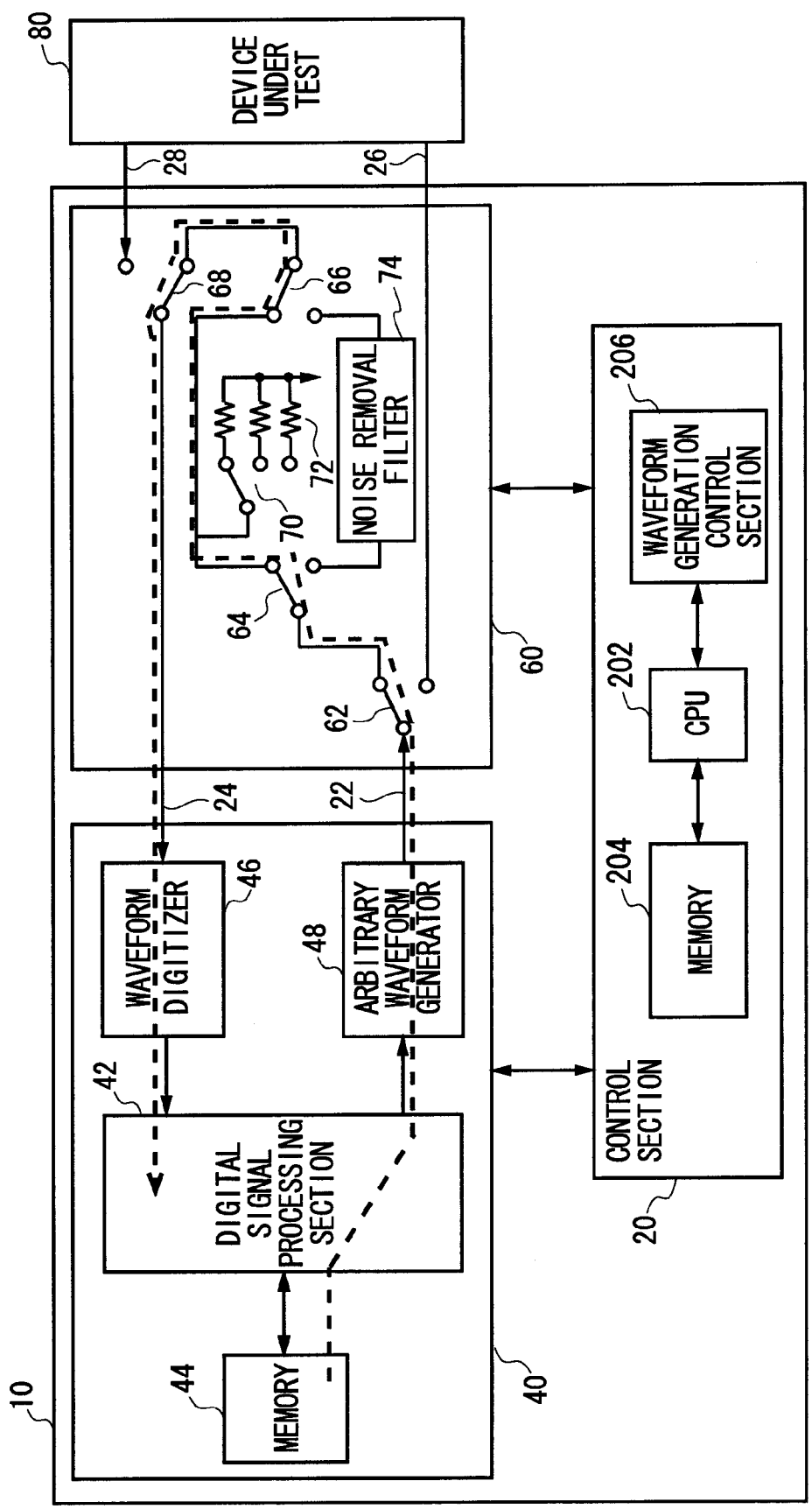
FIG. 27 shows the signal path when the semiconductor test apparatus performs the identification process for the arbitrary waveform generator.

FIG. 27 shows the signal path when the semiconductor test apparatus 10 performs the identification process for the arbitrary waveform generator 48. When the identification process for the arbitrary waveform generator 48 is performed, the control section 20 instructs the digital signal processing section 42 to generate the identification signal. The control section 20 switches the switch 62 and the switch 68 in the path switching section 60 to separate the path switching section 60 from the device under test 80. Furthermore, the control section 20 switches the switch 64 and the switch 66 to connect the arbitrary waveform generator 48 and the waveform digitizer 46 via the second transmission path in the loop-back path. The control section 20 may switch the switch 70 connected in the second transmission path to select a value of a load 72 connected to the second transmission path. The loads 72 may have values equal to various impedances expected for the device under test 80.

The digital signal processing section 42 is controlled by the control section 20 to read the waveform data stored in the memory 44. The digital signal processing section 42 uses the read waveform data to generate a reference digital signal used in the identification process for the arbitrary waveform generator 48, and outputs the reference digital signal to the arbitrary waveform generator 48. The arbitrary waveform generator 48 performs an analog conversion on the reference digital signal to generate the reference analog signal, and outputs the reference analog signal to the path switching section 60. The waveform digitizer 46 receives the reference analog signal via the second transmission path including the signal line 22, the switch 62, the switch 64, the switch 66, and the switch 68. The waveform digitizer 46 performs a digital conversion on the reference analog signal to generate the reference digital signal, and outputs the reference digital signal to the digital signal processing section 42.

Upon receiving the reference digital signal from the waveform digitizer 46, the digital signal processing section 42 reads the compensation coefficients of the waveform digitizer 46 from the memory 44 and eliminates the distortion caused by the waveform digitizer 46 from the received signal. Furthermore, the digital signal processing section 42 identifies the distortion of the arbitrary waveform generator 48 by analyzing the signal from which the distortion of the waveform digitizer 46 is eliminated. The digital signal processing section 42 may store in the memory 44 the distortion compensation coefficients calculated for the arbitrary waveform generator 48.

When performing the identification process for the arbitrary waveform generator 48, the distortion identifying section 440 may calculate compensation coefficients, used when compensating for the arbitrary waveform generator 48, for each type of load 72. The distortion identifying section 440 may calculate compensation coefficients in advance for each temperature of the semiconductor test apparatus 10. Furthermore, the distortion identifying section 440 may calculate compensation coefficients, used when compensating for the arbitrary waveform generator 48, for each output current of the arbitrary waveform generator 48. The distortion identifying section 440 may store in the memory 44 a table of compensation coefficients corresponding to types of loads 72, temperatures of the semiconductor test apparatus 10, output currents, or some combination of these characteristics.

When testing the device under test 80, the signal compensating section 460 may select the compensation coefficients for the test signal based on the compensation coefficients corresponding to the type of load 72 or the output current of the arbitrary waveform generator 48. Instead, the signal compensating section 460 may select the compensation coefficients according to characteristics or test conditions of the device under test 80. As another example, the signal compensating section 460 may select the compensation coefficients according to the temperature of the semiconductor test apparatus 10.

Figure 28:
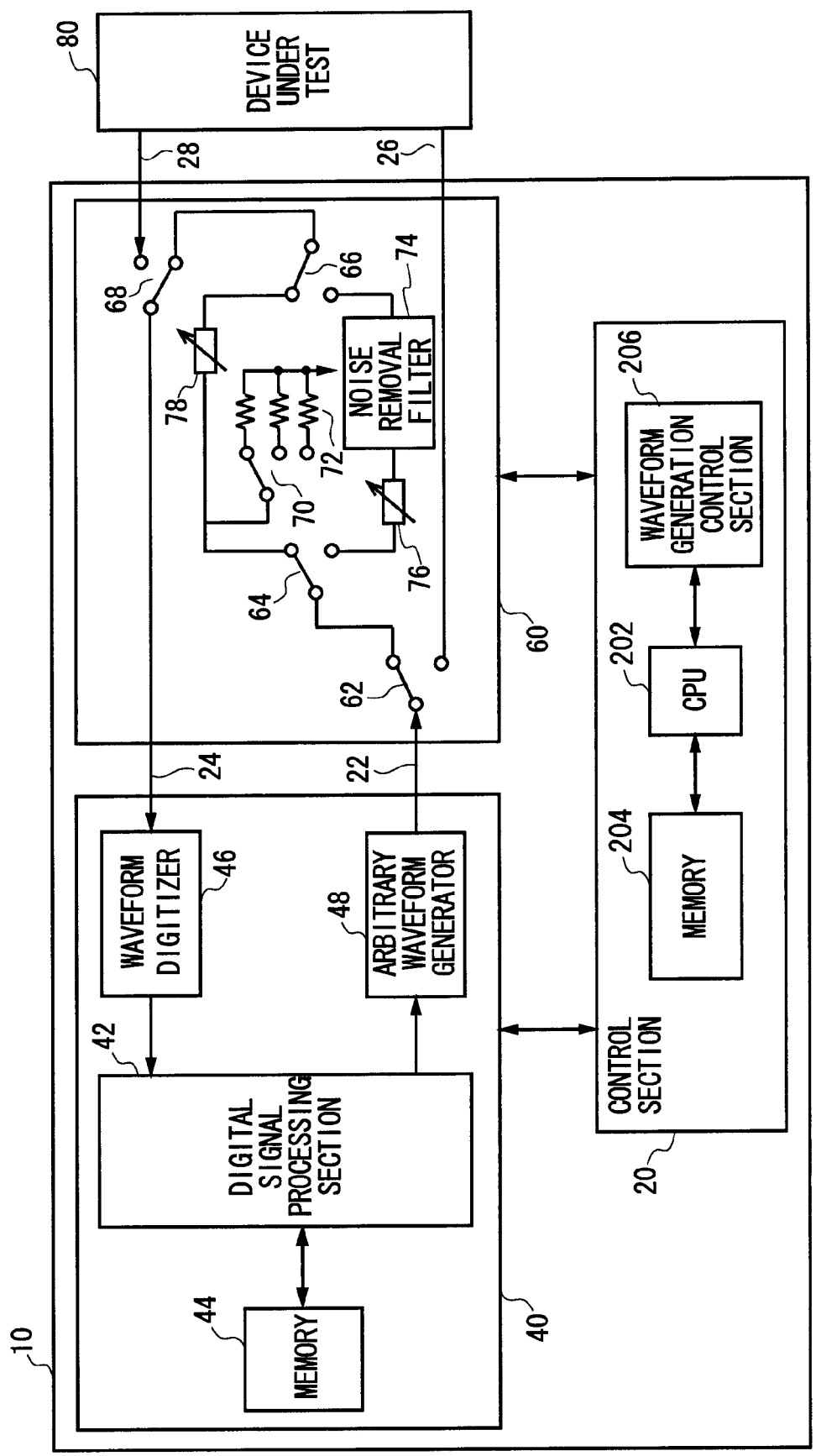
FIG. 28 shows the path switching section when performing a level conversion on the signal output by the arbitrary waveform generator.

FIG. 28 shows another embodiment relating to the path switching section 60. In this embodiment, the first transmission path includes a level converter 76 in series with the noise removal filter 74 between the switch 64 and the switch 66. The second transmission path includes a level converter 78 between the switch 64 and the switch 66. The level converter 76 may be an amplifier with a variable amplification rate, and the level converter 78 may be an attenuator with a variable attenuation rate.

If the input amplitude range of the waveform digitizer 46 is used to the maximum limit, the measurement by the waveform digitizer 46 is accurate. Accordingly, if the output amplitude range of the arbitrary waveform generator 48 is insufficient with respect to the input amplitude range of the waveform digitizer 46, the measurement accuracy of the waveform digitizer 46 drops. Furthermore, if the output amplitude range of the arbitrary waveform generator 48 is significantly greater than the input amplitude range of the waveform digitizer 46, the measurement accuracy of the waveform digitizer 46 drops.

To prevent this, the signal output by the arbitrary waveform generator 48 may be amplified or attenuated by changing the amplification rate of the level converter 76 or the attenuation rate of the level converter 78 according to the input amplitude range of the waveform digitizer 46 and the output amplitude range of the arbitrary waveform generator 48. In order for the input amplitude range of the waveform digitizer 46 to match the output amplitude range of the arbitrary waveform generator 48, the signal output by the arbitrary waveform generator 48 is desirably amplified or attenuated.

For example, when the output amplitude range of the arbitrary waveform generator 48 is less than the input amplitude range of the waveform digitizer 46, the semiconductor test apparatus 10 may perform the identification process for the waveform digitizer 46 after increasing the amplification rate of the level converter 76. On the other hand, when the output amplitude range of the arbitrary waveform generator 48 is greater than the input amplitude range of the waveform digitizer 46, the semiconductor test apparatus 10 may perform the identification process for the arbitrary waveform generator 48 after increasing the attenuation rate of the level converter 78.

Figure 29:
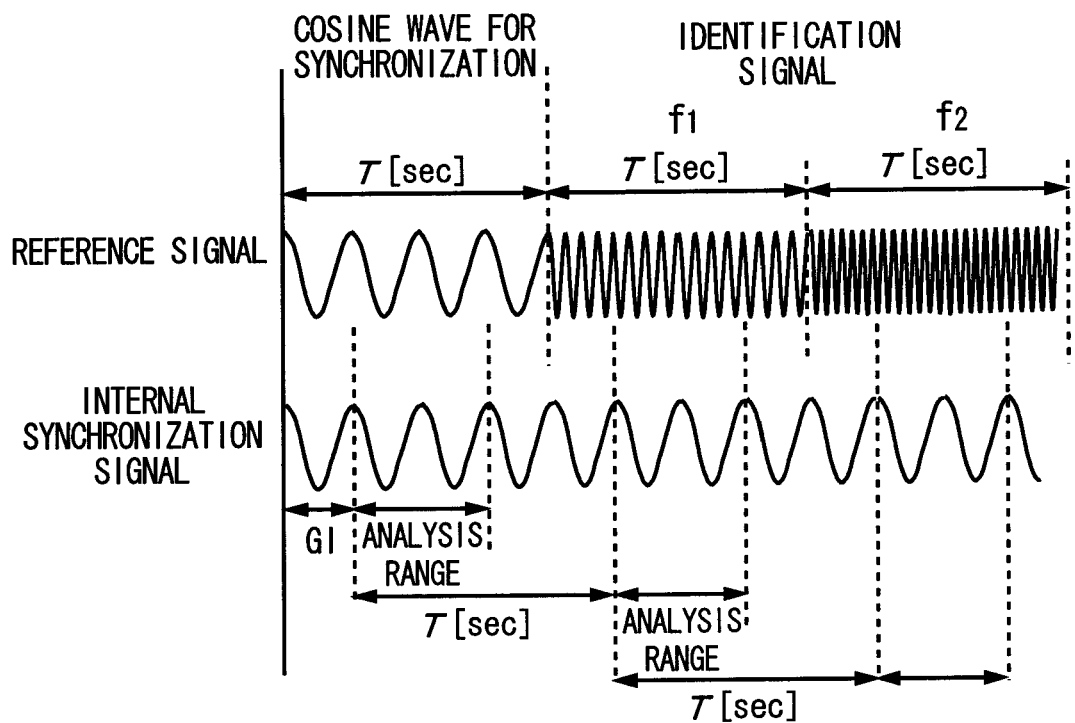
FIG. 29 shows an exemplary reference signal generated by the arbitrary waveform generator.

FIG. 29 shows an exemplary reference signal used in the identification processes for the waveform digitizer 46 and the arbitrary waveform generator 48. The arbitrary waveform generator 48 generates the reference analog signal by converting the reference digital signal generated by the signal output control section 450 into an analog signal. The signal output control section 450 may generate the reference digital signal based on the waveform data read from the memory 44, and output the reference digital signal to the arbitrary waveform generator 48. The signal output control section 450 may output the reference signal to the arbitrary waveform generator 48 while compensation coefficients are set in the compensation signal generating section 480.

In FIG. 29, the upper waveform represents the identification signal included in the reference signal. The signal output control section 450 may transmit an identification digital signal that includes a cosine wave of 1 MHz, for example, over a duration of T seconds from signal transmission initiation. The signal output control section 450 then transmits the identification digital signal to the arbitrary waveform generator 48 while sequentially changing the frequency between $f_1$, $f_2$, and $f_3$ at constant measurement cycles, such as durations of T seconds. The arbitrary waveform generator 48 generates the reference signal shown in FIG. 29 by performing an analog conversion on the digital signal received from the signal output control section 450.

The data extracting section 420 of the digital signal processing section 42 receives the reference signal via the waveform digitizer 46. The data extracting section 420 generates therein a cosine signal with a frequency of 1 MHz that is synchronized with an internal synchronization signal included in a leading portion of the reference signal. FIG. 29 shows the generated internal synchronization signal. The data extracting section 420 detects the timing for analyzing the identification signal according to a count of the generated internal synchronization signal.

The phase of the identification signal may be in synchronization with the phase of the internal identification signal. In other words, the phase relationship between these signals may be such that the phase of the identification signal is at a maximum when the phase of the internal identification signal is at a maximum. The period of the identification signal in the measurement cycle may be a fraction of the measurement cycle, where the numerator of the fraction is 1 and the denominator is an integer. The signal output control section 450 may control the duration of each measurement cycle such that the number of reference signal cycles in each measurement cycle is an integer value. In other words, the frequency of the identification signal may be an integer multiple of the frequency of the internal synchronization signal.

Upon receiving the reference signal from the waveform digitizer 46, the data extracting section 420 detects the starting point of the internal synchronization signal and begins counting the internal synchronization signal. After a prescribed time has passed since the starting point of the internal synchronization signal and after a prescribed wait time (G1) has passed since the initiation timing of the current cycle, the data extracting section 420 begins extracting the data included in the received reference signal. The data extracting section 420 may set the wait time to be a duration that is greater than or equal to the maximum signal period from among the signal periods at which the reference signal changes. The data extracting section 420 may instead set the wait time to be a duration that is a common multiple of each signal period at which the reference signal changes. By providing a wait time before and after the timing at which each measurement signal is discontinuous due to a change, the analyzed signal does not include reference signals with a plurality of different frequencies, and therefore the precision of the identification process is increased.

After a prescribed time has passed since the initiation of data extraction, the data extracting section 420 ends the data extraction. In each measurement cycle, the data extracting section 420 may extract a number of data points corresponding to an integer multiple of the period of the reference signal, beginning after the wait time and ending at the end time of the current measurement cycle. The signal output control section 450 may output a reference signal in which the signal period in each measurement cycle is a fraction of the analyzing duration corresponding to the period from the end of the wait time to the end of the measurement cycle, where the fraction has a numerator of 1 and a denominator that is an integer.

The distortion identifying section 440 receives the data extracted by the data extracting section 420 and detects the non-linear distortion for each frequency of the data. More specifically, the reference spectrum calculating section 442 calculates the spectrum in the received reference signal. For example, the reference spectrum calculating section 442 may calculate the frequency characteristics of the second-order harmonic waves and the third-order harmonic waves included in the identification signal at each frequency. The reference spectrum calculating section 442 may acquire the data of the digital signal over a duration that is an integer multiple of each measurement cycle, and perform a Fourier transform on this data.

Figure 30:
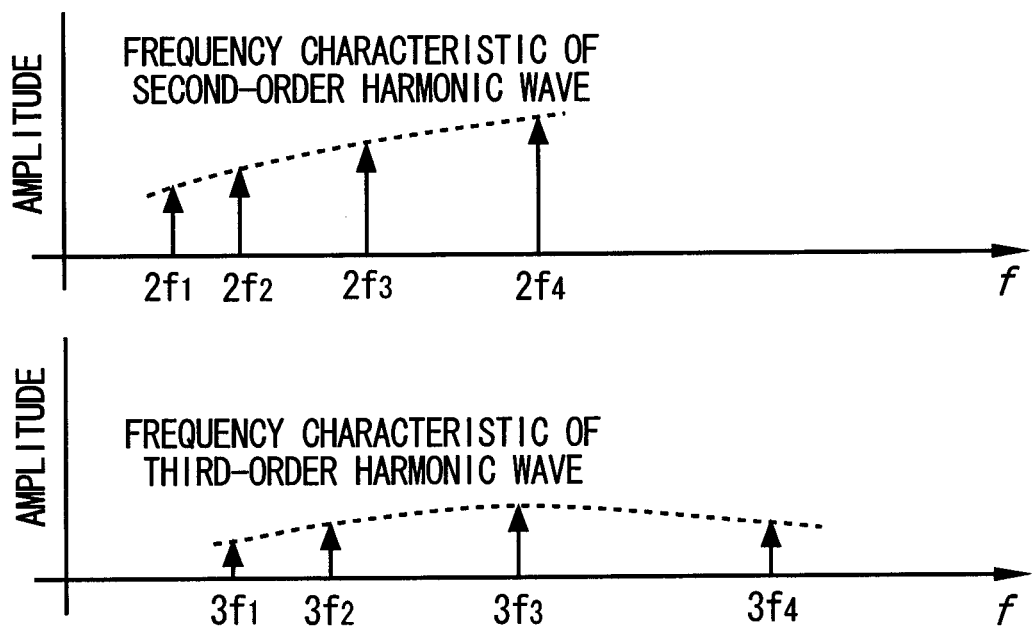
FIG. 30 shows frequency characteristics of harmonic waves.

FIG. 30 shows frequency characteristics of second-order harmonic waves and third-order harmonic waves calculated by the reference spectrum calculating section 442. The upper graph of FIG. 30 shows that the spectra of the second-order harmonic waves of identification signal with frequencies of $f_1$, $f_2$, $f_3$, and $f_4$ appear at frequencies of $2f_1$, $2f_2$, $2f_3$, and $2f_4$. The lower graph of FIG. 30 shows that the spectra of the third-order harmonic waves of the identification signal with frequencies of $f_1$, $f_2$, $f_3$, and $f_4$ appear at frequencies of $3f_1$, $3f_2$, and $3f_4$. Here, the frequencies $f_1$, $f_2$, $f_3$, and $f_4$ are respectively 1 MHz, 10 MHz, 100 MHz, and 1 GHz.

In order to accurately measure a signal that includes a variety of frequency components, the semiconductor test apparatus 10 desirably calculates compensation coefficients for as many frequencies as possible, and holds the calculated compensation coefficients. On the other hand, when the number of compensation coefficients held by the semiconductor test apparatus 10 increases, the time necessary for the identification process is lengthened and the amount of memory needed to store the compensation coefficients increases. Therefore, the semiconductor test apparatus 10 may generate distortion interpolation information obtained by interpolating a relationship between the non-linear distortion and the frequency between each frequency at which the reference signal changes, based on the non-linear distortion at each frequency detected by the distortion identifying section 440.

For example, the semiconductor test apparatus 10 may generate interpolation values for frequencies other than $f_1$, $f_2$, $f_3$, and $f_4$ included in the reference signal based on the amplitude of the second-order harmonic wave and the third-order harmonic wave of the frequencies $f_1$, $f_2$, $f_3$, and $f_4$, and may calculate compensation coefficients using the generated interpolation values. In FIG. 30, the dotted lines connecting the tips of the arrows representing the spectra of the second-order harmonic wave and the third-order harmonic wave of the frequencies $f_1$, $f_2$, $f_3$, and $f_4$ indicates the amplitude of the interpolated spectra. The interpolation method may be spline interpolation, spline regression, non-linear square method, or some other method. A distortion calculating section 449 may store in the memory 44 the compensation coefficients calculated using the calculated distortion interpolation information.

Figure 31:
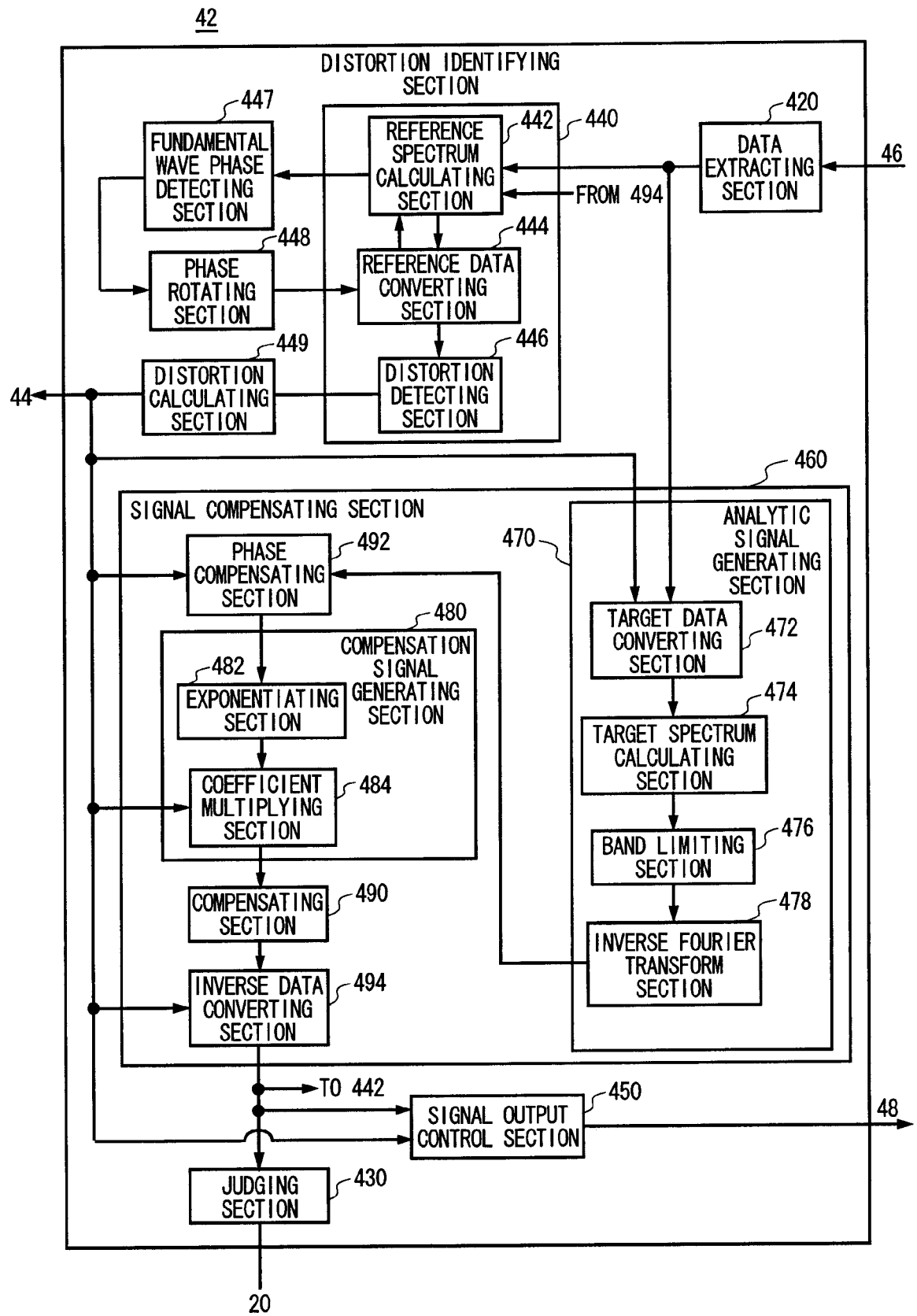
FIG. 31 shows a third exemplary configurational diagram of the digital signal processing section.

FIG. 31 shows the digital signal processing section 42 provided with the distortion calculating section 449 for calculating the distortion interpolation information. When an analog signal with a frequency different from the frequencies at which the reference signal changes is input to the digitizer, the distortion calculating section 449 may calculate the non-linear distortion caused by the waveform digitizer 46 based on the non-linear distortion at each frequency detected by the distortion identifying section 440.

Figure 32:
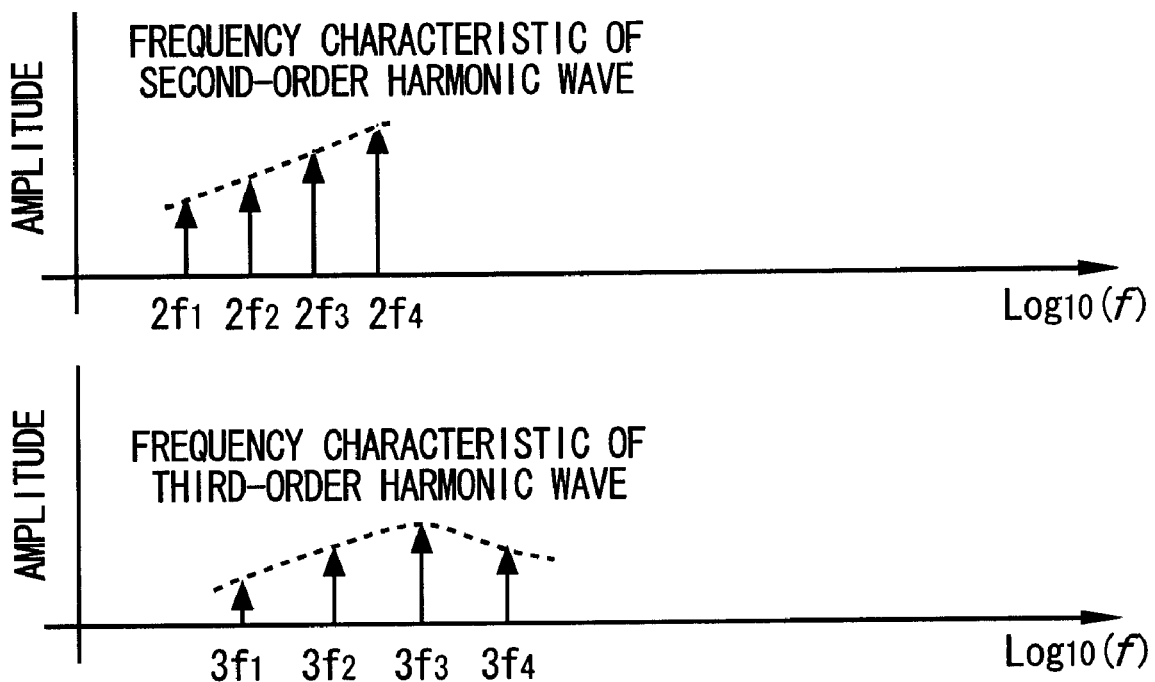
FIG. 32 shows frequency characteristics of the harmonic waves when a logarithmic conversion is applied to the frequency axis.

In the present example, however, the frequency interval between $f_3$ and $f_4$ is greater than the frequency interval between $f_1$ and $f_2$, and therefore the accuracy of the interpolation between frequencies $f_3$ and $f_4$ is lower. To solve this problem, the distortion calculating section 449 may generate the distortion interpolation information by converting the frequency of the reference signal with a logarithm. FIG. 32 shows the spectra of the second-order harmonic waves and the third-order harmonic waves of frequencies $f_1$, $f_2$, $f_3$, and $f_4$ when a logarithmic conversion is applied to the frequency axis. The distortion calculating section 449 generates the distortion interpolation information after performing a logarithmic conversion on the frequency of the reference signal, and can therefore interpolate between any frequency pairs with substantially the same accuracy since the intervals between frequency pairs are made substantially equal.

The above embodiments describe a calibration method for decreasing the second-order harmonic waves and the third-order harmonic waves. In other embodiments, the non-linear distortion of higher-order harmonic wave components may be detected sequentially, and compensation coefficients may be generated to correspond to each harmonic wave component. For example, if the polynomial expansion of the non-linear distortion shown in Expressions 4 to 7 is adapted for harmonic waves up to the fifth order, and the input signal is $Vin(t)=M_0 \times Cos(2\pi f_0 t + \theta_0)$, then the output voltage can be expressed as shown below.

$$Vout(t) = M_0 * Cos(2\pi f_0 t + \theta_0) + \sum_{i=2}^{5} A_i * (M_0 * Cos(2\pi f_0 t + \theta_0 + \varphi_i))^i$$

$$= \frac{M_0^2 \cdot A_2}{2} + \frac{3 \cdot M_0^4 \cdot A_4}{8} + \left( M_0 \cdot Cos(2\pi f_0 t + \theta_0) + \right.$$

$$\frac{3}{4} M_0^3 \cdot A_3 \cdot Cos(2\pi f_0 t + \theta_0 + \varphi_3) +$$

$$\left. \frac{10}{16} M_0^5 \cdot A_5 \cdot Cos(2\pi f_0 t + \theta_0 + \varphi_5) \right) +$$

$$\frac{M_0^2 \cdot A_2}{2} \cdot Cos(2\pi \cdot 2 f_0 t + 2\theta_0 + 2\varphi_2) +$$

$$\frac{4 \cdot M_0^4 \cdot A_4}{8} \cdot Cos(2\pi \cdot 2 f_0 t + 2\theta_0 + 2\varphi_4) +$$

$$\frac{M_0^3 \cdot A_3}{4} \cdot Cos(2\pi \cdot 3 f_0 t + 3\theta_0 + 3\varphi_3) +$$

$$\frac{5 \cdot M_0^5 \cdot A_5}{16} \cdot Cos(2\pi \cdot 3 f_0 t + 3\theta_0 + 3\varphi_5) +$$

$$\frac{M_0^4 \cdot A_4}{8} \cdot Cos(2\pi \cdot 4 f_0 t + 4\theta_0 + 4\varphi_4) +$$

$$\frac{M_0^5 \cdot A_5}{16} \cdot Cos(2\pi \cdot 5 f_0 t + 5\theta_0 + 5\varphi_5)$$

In this way, by setting the amplitude of the input signal as $H_1=GM_0 \cdot A_1$, the amplitude of the DC component, the second-order harmonic wave component, the third-order harmonic wave component, the fourth-order harmonic wave component, and the fifth-order harmonic wave component can be approximated as shown below.

$$H_0 = \frac{GM_0^2 \cdot A_2}{2}, \quad H_2 = \frac{GM_0^2 \cdot A_2}{2}, \quad H_3 = \frac{GM_0^3 \cdot A_3}{4},$$

$$H_4 = \frac{GM_0^4 \cdot A_4}{8}, \quad H_5 = \frac{GM_0^5 \cdot A_5}{16},$$

From these relationships, the polynomial coefficients $A_1$ to $A_5$ may be identified to calculate the compensation coefficients.

The third-order harmonic wave component mixes with the fundamental wave and the fifth-order harmonic wave component mixes with the third-order harmonic wave, and it is therefore desirable to perform sequential identification beginning with higher-order spectra. For example, if the fifth-order wave spectrum is represented as $|G_5|\cdot\exp(j\cdot q_5)$, then the fifth-order wave is expressed as shown below having a phase five times that of the fundamental wave.

$$|G_5|\cdot\exp(j\cdot q_5) = \frac{M_0^5 \cdot A_5}{16} \cdot \exp(j\cdot(5\theta_0 + 5\varphi_5)) \quad (22)$$

Since the phase that can be calculated from the spectrum is only a principal value, the addition of an angle that is an integer multiple of $2\pi$ to the actual angle cannot be detected. In other words, it is possible that calculating $\frac{1}{5}$ of the phase $q_5$ obtained from the spectrum does not result in $\phi_5$.

Here, if the range of possible values for $\phi_5$ are expressed by Expression 23, then the range of possible values for $q_5$ can be expressed as shown in Expression 24.

$$-\pi \leq \phi_5 < \pi \quad (23)$$

$$-5\pi \leq q_5 < 5\pi \quad (24)$$

The phase may be sought within this range. In other words, with n representing an integer, the following expression can be used to find an optimal value by changing n within the range of Expression 25.

$$\bar{q}_5 = q_5 + 2\pi\cdot n \quad (25)$$

For example, the possible values are used to perform polynomial compensation, and the optimal value is determined to be the value at which the distortion component caused by the fifth-order harmonic wave component, i.e. both the fifth-order harmonic wave distortion and the third-order harmonic wave distortion, is at a minimum value. An optimal value for the fourth-order harmonic wave and the second-order harmonic wave can be obtained in the same manner.

As another exemplary embodiment, the higher-order harmonic distortion can be eliminated by repeating the identification process compensating for the second-order harmonic wave and the third-order harmonic wave. For example, the identification process for the waveform digitizer 46 may use a signal generated by the arbitrary waveform generator 48 on which the identification process compensating for the second-order harmonic wave and the third-order harmonic wave has been performed. When the distortion of the identification signal is decreased, the accuracy of the identification process increases and the distortion in the compensated signal decreases. Accordingly, if the semiconductor test apparatus 10 performs the identification process for the waveform digitizer 46 using the signal formed by the noise removal filter 74 from the compensated signal output by the arbitrary waveform generator 48, the semiconductor test apparatus 10 can decrease higher orders of harmonic distortion.

The identification process algorithm is described above using a model in which the linear distortion generation source generates single non-linear distortion, as shown in FIG. 20. However, the applicable range of the identification process algorithm is not limited to the above model, and may be applied to other non-linear distortion generation models.

Figure 33:
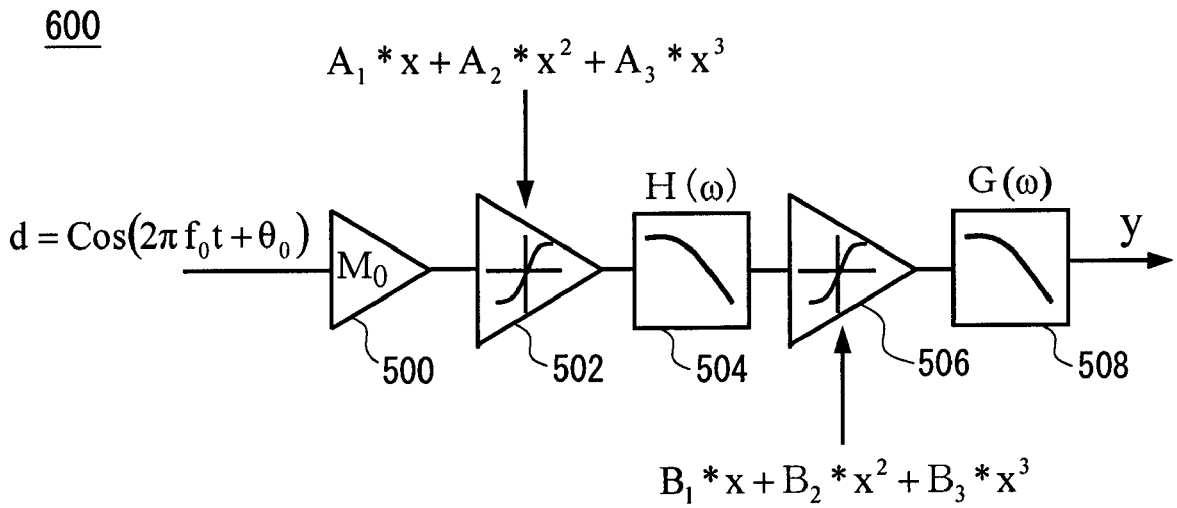
FIG. 33 shows a non-linear distortion generation model of a system that mixes a plurality of types of linear distortion and non-linear distortion.

FIG. 33 shows a non-linear distortion generation model of a system 600 that mixes a plurality of types of linear distortion and non-linear distortion. For example, the system 600 may have a generation model for linear distortion and non-linear distortion caused by circuits in the arbitrary waveform generator 48 shown in FIG. 1. In FIG. 33, the input signal d is input to the system 600 and, after an amplifier 500 multiplies the amplitude of this signal by $M_0$, this signal is output via a non-linear amplifier 502, a filter 504, a non-linear amplifier 506, and a filter 508. The filter 504 and the filter 508 each cause linear distortion in signals input thereto.

For example, the input signal d input to the system 600 may be the reference analog signal 118 obtained by performing an analog conversion on the reference digital signal 116 generated by the digital signal processing section 42. The output signal y output from the system 600 may be the signal output by the arbitrary waveform generator 48.

The digital signal processing section 42 performs the identification process based on the output signal y, and calculates compensation coefficients for the non-linear distortion. When outputting a test signal to the arbitrary waveform generator 48, the digital signal processing section 42 may generate the test signal based on a pre-distortion signal that compensates for the second-order harmonic wave component and the third-order harmonic wave component generated using the calculated coefficients. The following describes the digital signal processing section 42 performing the identification process for the system 600.

In the system 600, the non-linear amplifier 502 causes non-linear distortion in the input signal x input thereto, and outputs the resulting signal shown below.

$$A_1*x + A_2*x^2 + A_3*x^3$$

The non-linear amplifier 506 causes non-linear distortion in the input signal x input thereto, and outputs the resulting signal shown below.

$$B_1*x + B_2*x^2 + B_3*x^3$$

Here, the fundamental wave component, the second-order harmonic wave component, and the third-order harmonic wave component of the spectrum of the signal output by the filter 504 are as follows.

$$M_0 H(\omega_0) A_1$$

$$\frac{M_0^2 H(2\omega_0) A_2}{2}$$

$$\frac{M_0^3 H(3\omega_0) A_3}{4}$$

The fundamental wave component, the second-order harmonic wave component, and the third-order harmonic wave component of the spectrum of the signal output by the filter 508 are as follows.

$$Y(\omega_0) = M_0 H(\omega_0) G(\omega_0) A_1 B_1$$

$$Y(2\omega_0) = G(2\omega_0)\left(\frac{M_0^2 H(2\omega_0) A_2 B_1}{2} + \frac{(M_0 H(\omega_0) A_1)^2 B_2}{2}\right) \quad (26)$$

$$= \frac{M_0^2 G(2\omega_0)}{2}(H(2\omega_0) A_2 B_1 + H^2(\omega_0) A_1^2 B_2)$$

$$Y(3\omega_0) = G(3\omega_0)\left(\frac{M_0^3 H(3\omega_0) A_3 B_1}{4} + \frac{(M_0 H(\omega_0) A_1)^3 B_3}{4}\right) \quad (27)$$

$$= \frac{M_0^3 G(3\omega_0)}{4}(H(3\omega_0) A_3 B_1 + H^3(\omega_0) A_1^3 B_3)$$

Here, when calculating the compensation coefficients, the configurational elements of the system 600 are substituted.

Figure 34:
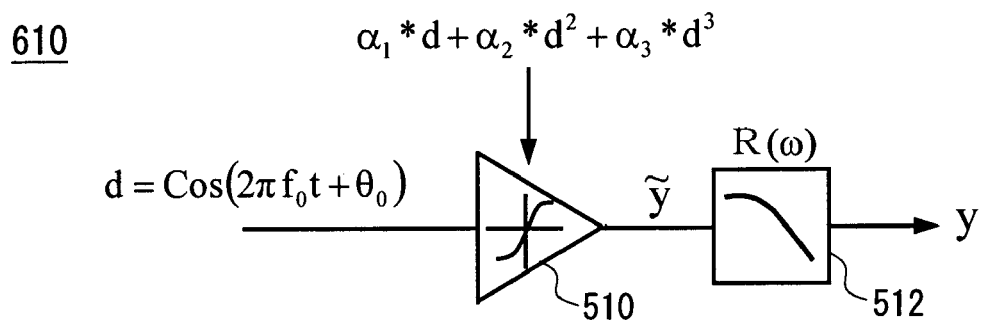
FIG. 34 shows a system that is equivalent to the system of FIG. 33 when the configurational elements are substituted.

FIG. 34 shows a system 610 which is equivalent to the system 600 of FIG. 33 when the configurational elements are substituted. In FIG. 34, a non-linear system section 510 is a model that substitutes for the amplifier 500, the non-linear amplifier 502, and the non-linear amplifier 506. The linear system section 512 is a model that substitutes for the filter 504 and the filter 508. The non-linear system section 510 causes non-linear distortion in the input signal d, and outputs the resulting signal shown below.

$$\alpha_1 * d + \alpha_2 * d^2 + \alpha_3 * d^3$$

The digital signal processing section 42 calculates the compensation coefficients $\alpha_2$ and $\alpha_3$ by identifying the non-linear distortion caused by the system 610 based on the output signal y when a cosine signal d with a prescribed frequency is input to the system. The digital signal processing section 42 may generate a pre-distortion signal based on the calculated compensation coefficients $\alpha_2$ and $\alpha_3$. The digital signal processing section 42 can compensate for the non-linear distortion and the linear distortion caused by the non-linear system section 510 and the linear system section 512 by using the generated pre-distortion signal as the input signal input to the system 610.

In the identification process, the digital signal processing section 42 first corrects the distortion caused by the linear system section 512. The fundamental wave component, the second-order harmonic wave component, and the third-order harmonic wave component of the spectrum of the signal output by the linear system section 512 are as follows.

$$R(\omega_0) = M_0 H(\omega_0) G(\omega_0) A_1 B_1 \tag{28}$$

$$R(2\omega_0) = M_0 H(2\omega_0) G(2\omega_0) A_1 B_1 \tag{29}$$

$$R(3\omega_0) = M_0 H(3\omega_0) G(3\omega_0) A_1 B_1 \tag{30}$$

Here, the digital signal processing section 42 normalizes the linear distortion in the linear system section by multiplying the second-order harmonic wave component included in the output signal y by the linear correction coefficient $R(\omega_0)/R(2\omega_0)$ and multiplying the third-order harmonic wave component included in the output signal y by the linear correction coefficient $R(\omega_0)/R(3\omega_0)$.

More specifically, the amplitude of the second-order harmonic wave signal and the third-order harmonic wave signal included in the output signal of the non-linear system section 510 are calculated by multiplying the second-order harmonic wave signal and the third-order harmonic wave signal included in the output signal y by the linear correction coefficients. In other words, if the fundamental wave component is represented as $Y(\omega 0) = R(\omega 0)$, the amplitude of the second-order harmonic wave signal included in the output signal of the non-linear system section 510 can be expressed by Expression 31.

$$\tilde{Y}(2\omega_0) = Y(2\omega_0) \cdot \frac{R(\omega_0)}{R(2\omega_0)} \tag{31}$$

$$= \frac{R(\omega_0) G(2\omega_0)}{M_0 H(2\omega_0) G(2\omega_0) A_1 B_1}$$

$$\left( \frac{M_0^2 H(2\omega_0) A_2 B_1}{2} + \frac{(M_0 H(\omega_0) A_1)^2 B_2}{2} \right)$$

$$= \frac{R(\omega_0) M_0}{2} \left( \frac{A_2}{A_1} + \frac{H^2(\omega_0) A_1 B_2}{H(2\omega_0) B_1} \right)$$

Furthermore, the amplitude of the third-order harmonic wave signal included in the output signal of the non-linear system section 510 can be expressed by Expression 32.

$$\tilde{Y}(3\omega_0) = Y(3\omega_0) \cdot \frac{R(\omega_0)}{R(3\omega_0)} \tag{32}$$

$$= \frac{R(\omega_0) G(3\omega_0)}{M_0 H(3\omega_0) G(3\omega_0) A_1 B_1}$$

$$\left( \frac{M_0^3 H(3\omega_0) A_3 B_1}{4} + \frac{(M_0 H(\omega_0) A_1)^3 B_3}{4} \right)$$

$$= \frac{R(\omega_0) M_0^2}{4} \left( \frac{A_3}{A_1} + \frac{H^3(\omega_0) A_1^2 B_3}{H(3\omega_0) B_1} \right)$$

From Expressions 31 and 32, non-linear distortion compensation coefficients α2 and α3 can be calculated as shown below.

$$\tilde{\alpha}_2 = \frac{\tilde{Y}(2\omega_0)}{Y(\omega_0)} = \frac{M_0}{2} \left( \frac{A_2}{A_1} + \frac{H^2(\omega_0) A_1 B_2}{H(2\omega_0) B_1} \right) \tag{33}$$

$$\tilde{\alpha}_3 = \frac{\tilde{Y}(3\omega_0)}{Y(\omega_0)} = \frac{M_0^2}{4} \left( \frac{A_3}{A_1} + \frac{H^3(\omega_0) A_1^2 B_3}{H(3\omega_0) B_1} \right) \tag{34}$$

The following shows that the digital signal processing section 42 can compensate for non-linear distortion and linear distortion caused by the system 600 by generating a pre-distortion signal using the compensation coefficients shown by Expressions 33 and 34. The pre-distortion signal is shown by Expression 35.

$$\tilde{d} = d - (\tilde{\alpha}_2 \cdot d^2 + \tilde{\alpha}_3 \cdot d^3) \tag{35}$$

From Expressions 26, 29, and 33, the second-order harmonic distortion occurring when the pre-distortion signal is input to the system 600 can be calculated as follows.

$$Y(2\omega_0) = G(2\omega_0) \left( \frac{M_0^2 H(2\omega_0) A_2 B_1}{2} + \frac{(M_0 H(\omega_0) A_1)^2 B_2}{2} \right) -$$

$$M_0 A_1 H(2\omega_0) B_1 G(2\omega_0) \cdot \tilde{\alpha}_2$$

$$= \frac{M_0^2 G(2\omega_0)}{2} (H(2\omega_0) A_2 B_1 + H^2(\omega_0) A_1^2 B_2) -$$

$$A_1 H(2\omega_0) B_1 \frac{M_0^2 G(2\omega_0)}{2} \left( \frac{A_2}{A_1} + \frac{H^2(\omega_0) A_1 B_2}{H(2\omega_0) B_1} \right)$$

$$= 0$$

From Expressions 27, 30, and 34, the third-order harmonic distortion occurring when the pre-distortion signal is input to the system 600 can be calculated as follows.

$$Y(3\omega_0) = G(3\omega_0) \left( \frac{M_0^3 H(3\omega_0) A_3 B_1}{4} + \frac{(M_0 H(\omega_0) A_1)^3 B_3}{4} \right) -$$

$$M_0 A_1 H(3\omega_0) B_1 G(3\omega_0) \cdot \tilde{\alpha}_3$$

$$= \frac{M_0^3 G(3\omega_0)}{4} (H(3\omega_0) A_3 B_1 + H^3(\omega_0) A_1^3 B_3) -$$

$$A_1 H(3\omega_0) B_1 \frac{M_0^3 G(3\omega_0)}{2} \left( \frac{A_3}{A_1} + \frac{H^3(\omega_0) A_1^2 B_3}{H(3\omega_0) B_1} \right)$$

$$= 0$$

Since $Y(2\omega 0)$ and $Y(3\omega 0)$ are equal to 0, the non-linear distortion and the linear distortion can be compensated for by the digital signal processing section 42 inputting the pre-distortion signal to the system 600.

As made clear from the above, the identification process described using FIGS. 20 to 24 can also be applied to a configuration in which the signal path includes several stages of non-linear distortion and linear distortion.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A signal processing apparatus comprising a digitizer that converts an input analog signal into a digital signal and a distortion identifying section that identifies non-linear distortion in a reference digital signal generated by the digitizer when the digitizer is supplied with a reference analog signal, wherein the distortion identifying section includes:
   a reference spectrum calculating section that calculates a spectrum of the reference digital signal;
   a reference data converting section that rearranges each of a plurality of frequency components in the spectrum such that (i) a fundamental wave component and harmonic wave components of the reference digital signal are within a first Nyquist region of the spectrum of the reference digital signal and (ii) image components of the fundamental wave component and the harmonic wave components are within a second Nyquist region of the spectrum; and
   a distortion detecting section that detects the non-linear distortion of the reference digital signal caused by each harmonic wave component, based on each harmonic wave component having a prescribed order number in the spectrum in which each frequency component has been rearranged by the reference data converting section.

2. The signal processing apparatus according to claim 1, wherein
   the reference data converting section rearranges each frequency component in the spectrum such that, for each order number of harmonic wave, the frequency of the harmonic wave component becomes a predetermined frequency in the first Nyquist region.

3. The signal processing apparatus according to claim 2, wherein
   the reference data converting section rearranges each frequency component in the spectrum such that the fundamental wave component moves to a first frequency bin in the spectrum and each harmonic wave component moves to a frequency bin in the spectrum whose number is the same as the order number of the harmonic wave component.

4. The signal processing apparatus according to claim 3, wherein
   the reference data converting section causes the frequency component at the frequency bin number that is k-times the frequency bin number of the fundamental wave component in the spectrum calculated by the reference spectrum calculating section to be the frequency component at the k-th frequency bin in the spectrum whose data has been rearranged, k being a natural number, and
   if k-times the frequency bin number of the fundamental wave component is greater than a maximum frequency bin number in the spectrum, the reference data converting section causes (i) the frequency component at the frequency bin number corresponding to a value obtained by subtracting, from k-times the frequency bin number of the fundamental wave component, a value according to the maximum frequency bin number to be (ii) the frequency component at the k-th frequency bin in the spectrum whose data has been rearranged.

5. The signal processing apparatus according to claim 1, further comprising:
   a fundamental wave phase detecting section that detects a phase of the fundamental wave component of the reference digital signal based on the spectrum calculated by the reference spectrum calculating section; and
   a phase rotating section that rotates the phase of each frequency component in the spectrum in which each frequency component has been rearranged by the reference data converting section, based on the phase of the fundamental wave component.

6. The signal processing apparatus according to claim 5, wherein
   the distortion detecting section (i) detects a phase component of the non-linear distortion caused by each harmonic wave component, based on the phase of each harmonic wave component having the prescribed order number in the spectrum output by the phase rotating section and (ii) detects an amplitude component of the non-linear distortion caused by each harmonic wave component, based on an amplitude of the fundamental wave component and the amplitude of each harmonic wave component having the prescribed order number in the spectrum output by the phase rotating section.

7. The signal processing apparatus according to claim 6, wherein
   the distortion detecting section sequentially detects the non-linear distortion caused by the harmonic wave components beginning with harmonic wave components having higher order numbers.

8. The signal processing apparatus according to claim 7, wherein
   the distortion detecting section detects the non-linear distortion caused by each harmonic wave component based on the harmonic wave component and harmonic wave components with higher orders.

9. The signal processing apparatus according to claim 1, wherein
   the reference data converting section rearranges each frequency component in the spectrum output by the reference spectrum calculating section by rearranging data of the reference digital signal along a time axis and supplying the rearranged data to the reference spectrum calculating section.

10. The signal processing apparatus according to claim 1, wherein
   the reference spectrum calculating section acquires data of the digital signal over a duration that is an integer multiple of a period of the reference digital signal, and performs a Fourier transform on the acquired data.

11. The signal processing apparatus according to claim 1, further comprising a signal compensating section that compensates for the non-linear distortion in the digital signal caused by the digitizer by compensating the digital signal generated by the digitizer according to the non-linear distortion identified in advance by the distortion identifying section based on the reference digital signal, wherein
the signal compensating section includes:
an analytic signal generating section that generates an analytic signal of the digital signal;
a compensation signal generating section that generates compensation signals that compensate for the non-linear distortion of the digital signal, based on exponentiated signals obtained by raising the analytic signal to powers; and
a compensating section that compensates for the non-linear distortion by subtracting each compensation signal from the digital signal, and
the analytic signal generating section includes:
a target data converting section that rearranges the data of the digital signal along the time axis to change the frequency thereof;
a target spectrum calculating section that calculates a pre-compensated spectrum of the digital signal by performing a Fourier transform on the data whose frequency has been changed by the target data converting section;
a band limiting section that eliminates the frequency components in the second Nyquist region of the pre-compensated spectrum in which each frequency component has been rearranged by the target data converting section; and
an inverse Fourier transform section that generates the analytic signal by performing an inverse Fourier transform on the pre-compensated spectrum output by the band limiting section.

12. The signal processing apparatus according to claim 1, further comprising a signal compensating section that compensates for the non-linear distortion in the digital signal caused by the digitizer by compensating the digital signal generated by the digitizer according to the non-linear distortion identified in advance by the distortion identifying section based on the reference digital signal, wherein
the signal compensating section includes:
an analytic signal generating section that generates an analytic signal of the digital signal;
a compensation signal generating section that generates compensation signals that compensate for the non-linear distortion of the digital signal, based on exponentiated signals obtained by raising the analytic signal to powers; and
a compensating section that compensates for the non-linear distortion by subtracting each compensation signal from the digital signal, and
the analytic signal generating section includes:
a target spectrum calculating section that calculates a pre-compensated spectrum of the digital signal by performing a Fourier transform on the digital signal;
a target data converting section that rearranges each frequency component in the pre-compensated spectrum such that (i) the fundamental wave component and the harmonic wave components of the digital signal are within the first Nyquist region of the pre-compensated spectrum and (ii) the image components of the fundamental wave component and the harmonic wave components are within the second Nyquist region of the pre-compensated spectrum;
a band limiting section that eliminates the frequency components in the second Nyquist region of the pre-compensated spectrum in which each frequency component has been rearranged by the target data converting section; and
an inverse Fourier transform section that generates the analytic signal by performing an inverse Fourier transform on the pre-compensated spectrum output by the band limiting section.

13. The signal processing apparatus according to claim 11, wherein the compensation signal generating section includes:
an exponentiating section that generates exponentiated signals by raising the analytic signal to a power equal to the order number of each of a corresponding harmonic wave component from among the harmonic wave components having the prescribed order numbers in the digital signal; and
a coefficient multiplying section that generates the compensation signals by multiplying (i) each exponentiated signal by (ii) a coefficient corresponding to the non-linear distortion caused by each harmonic wave component and identified by the distortion detecting section.

14. The signal processing apparatus according to claim 13, further comprising a phase compensating section that generates a plurality of types of the analytic signal by compensating the phase of the analytic signal generated by the analytic signal generating section according to the phase of each harmonic wave component, and supplies the generated analytic signals to the exponentiating section, wherein
the exponentiating section raises each analytic signal to a power according to the order number of the corresponding harmonic wave component.

15. The signal processing apparatus according to claim 14, further comprising an inverse data converting section that rearranges each frequency component in a compensated spectrum of the digital signal output by the compensating section such that each frequency component in the compensated spectrum is returned to an original frequency, the original frequency being the frequency of the frequency component prior to being moved by the target data converting section.

16. The signal processing apparatus according to claim 15, wherein
the target data converting section rearranges each frequency component in the pre-compensated spectrum such that, for each order number of harmonic wave, the frequency of the harmonic wave component becomes a predetermined frequency in the first Nyquist region.

17. The signal processing apparatus according to claim 16, wherein
the target data converting section rearranges each frequency component in the pre-compensated spectrum such that the fundamental wave component moves to a first frequency bin in the pre-compensated spectrum and each harmonic wave component moves to a frequency bin in the pre-compensated spectrum whose number is the same as the order number of the harmonic wave component
the reference data converting section rearranges each frequency component in the spectrum such that the fundamental wave component moves to a first frequency bin in the spectrum and each harmonic wave component moves to a frequency bin in the spectrum whose number is the same as the order number of the harmonic wave component.

18. The signal processing apparatus according to claim 17, wherein the target data converting section causes the frequency component at the frequency bin number that is k-times the frequency bin number of the fundamental wave component in the pre-compensated spectrum to be the frequency component at the k-th frequency bin in the pre-compensated spectrum whose data has been rearranged, k being a natural number, and if k-times the frequency bin number of the fundamental wave component is greater than the maximum frequency bin number in the pre-compensated spectrum, the target data converting section causes (i) the frequency component at the frequency bin number corresponding to a value obtained by subtracting, from k-times the frequency bin number of the fundamental wave component, a value according to the maximum frequency bin number to be (ii) the frequency component at the k-th frequency bin in the pre-compensated spectrum whose data has been rearranged.

19. The signal processing apparatus according to claim 11, wherein the signal compensating section detects a DC component of the digital signal generated by the digitizer, removes the DC component from the digital signal, compensates for the non-linear distortion in the digital signal, and adds the removed DC component to the compensated digital signal.

20. A signal processing apparatus comprising a digitizer that converts an analog signal input from an external section into a digital signal and a signal compensating section that compensates for non-linear distortion in the digital signal generated by the digitizer, wherein the signal compensating section includes:

an analytic signal generating section that generates an analytic signal of the digital signal;

a compensation signal generating section that generates compensation signals that compensate for the non-linear distortion of the digital signal, based on signals obtained by raising the analytic signal to powers; and a compensating section that compensates for the non-linear distortion by subtracting each compensation signal from the digital signal, and the analytic signal generating section includes:

a target spectrum calculating section that calculates a pre-compensated spectrum of the digital signal by performing a Fourier transform on the digital signal;

a target data converting section that rearranges each of a plurality of frequency components in the pre-compensated spectrum such that (i) a fundamental wave component and harmonic wave components of the digital signal are within a first Nyquist region of the pre-compensated spectrum and (ii) image components of the fundamental wave component and the harmonic wave components are within a second Nyquist region of the pre-compensated spectrum;

a band limiting section that eliminates the frequency components in the second Nyquist region of the pre-compensated spectrum output by the target data converting section; and an inverse Fourier transform section that generates the analytic signal by converting the pre-compensated spectrum output by the band limiting section into a signal in the time domain.

21. The signal processing apparatus according to claim 20, further comprising:

a waveform generator that outputs to an external section an analog signal having a prescribed waveform; and a distortion identifying section that identifies the non-linear distortion in the analog signal output by the waveform generator, wherein the distortion identifying section includes:

a signal output control section that causes the waveform generator to output a prescribed reference signal while coefficients for generating the compensation signals are set in the compensation signal generating section of the digitizer;

a reference spectrum calculating section that calculates a spectrum of the reference digital signal output by the digitizer according to the reference signal;

a reference data converting section that rearranges each of a plurality of frequency components in the spectrum along a frequency axis such that (i) a fundamental wave component and harmonic wave components of the reference digital signal are within a first Nyquist region of the spectrum of the reference digital signal and (ii) image components of the fundamental wave component and the harmonic wave components are within a second Nyquist region of the spectrum; and a distortion detecting section that detects the non-linear distortion of the reference digital signal caused by each harmonic wave component, based on each harmonic wave component having a prescribed order number in the spectrum in which each frequency component has been rearranged by the reference data converting section, and calculates the non-linear distortion caused by the waveform generator to be the detected non-linear distortion.

22. A signal processing apparatus comprising a waveform generator that outputs to an external section an analog signal having a prescribed waveform and a signal compensating section that compensates for non-linear distortion in the analog signal generated by the waveform generator, wherein the signal compensating section includes:

an analytic signal generating section that generates an analytic signal of the analog signal;

a compensation signal generating section that generates compensation signals that compensate for the non-linear distortion of the analog signal, based on signals obtained by raising the analytic signal to powers; and a compensating section that compensates for the non-linear distortion by subtracting each compensation signal from the analog signal, and the analytic signal generating section includes:

a target spectrum calculating section that calculates a pre-compensated spectrum of the analog signal;

a target data converting section that rearranges each of a plurality of frequency components in the pre-compensated spectrum such that (i) a fundamental wave component and harmonic wave components of the analog signal are within a first Nyquist region of the pre-compensated spectrum and (ii) image components of the fundamental wave component and the harmonic wave components are within a second Nyquist region of the pre-compensated spectrum;

a band limiting section that eliminates the frequency components in the second Nyquist region of the pre-compensated spectrum output by the target data converting section; and an inverse Fourier transform section that generates the analytic signal by converting the pre-compensated spectrum output by the band limiting section into a signal in the time domain.

23. A test system that tests a device under test, comprising:
a signal processing apparatus that exchanges signals with the device under test; and
a judging section that judges acceptability of the device under test based on an output signal of the device under test received by the signal processing apparatus wherein said signal processing apparatus comprising a digitizer that converts an input analog signal into a digital signal and a distortion identifying section that identifies non-linear distortion in a reference digital signal generated by the digitizer when the digitizer is supplied with a reference analog signal, wherein the distortion identifying section includes:
a reference spectrum calculating section that calculates a spectrum of the reference digital signal;
a reference data converting section that rearranges each of a plurality of frequency components in the spectrum such that (i) a fundamental wave component and harmonic wave components of the reference digital signal are within a first Nyquist region of the spectrum of the reference digital signal and (ii) image components of the fundamental wave component and the harmonic wave components are within a second Nyquist region of the spectrum; and
a distortion detecting section that detects the non-linear distortion of the reference digital signal caused by each harmonic wave component, based on each harmonic wave component having a prescribed order number in the spectrum in which each frequency component has been rearranged by the reference data converting section.

24. A distortion detecting apparatus that detects non-linear distortion in a target signal, comprising:
a spectrum calculating section that calculates a spectrum of the target signal;
a data converting section that rearranges each of a plurality of frequency components in the spectrum such that (i) a fundamental wave component and harmonic wave components of the target signal are within a first Nyquist region of the spectrum and (ii) image components of the fundamental wave component and the harmonic wave components are within a second Nyquist region of the spectrum; and
a distortion detecting section that detects the non-linear distortion of the target signal caused by each harmonic wave component, based on each harmonic wave component having a prescribed order number in the spectrum in which each frequency component has been rearranged by the data converting section.

25. A signal compensation apparatus that compensates for non-linear distortion in a target signal, comprising:
an analytic signal generating section that generates an analytic signal of the target signal;
a compensation signal generating section that generates compensation signals that compensate for the non-linear distortion of the target signal, based on signals obtained by raising the analytic signal to powers; and
a compensating section that compensates for the non-linear distortion by subtracting each compensation signal from the target signal, wherein the analytic signal generating section includes:
a spectrum calculating section that calculates a pre-compensated spectrum of the target signal by performing a Fourier transform on sampling data acquired by sampling, with a prescribed period, a signal level of the target signal;
a data converting section that rearranges each of a plurality of frequency components in the pre-compensated spectrum such that (i) a fundamental wave component and harmonic wave components of the target signal are within a first Nyquist region of the pre-compensated spectrum and (ii) image components of the fundamental wave component and the harmonic wave components are within a second Nyquist region of the pre-compensated spectrum;
a band limiting section that eliminates the frequency components in the second Nyquist region of the pre-compensated spectrum output by the data converting section; and
an inverse Fourier transform section that generates the analytic signal by converting the pre-compensated spectrum output by the band limiting section into a signal in the time domain.

26. An analytic signal generating apparatus that generates an analytic signal of a target signal based on a sampling result of the target signal, comprising:
a spectrum calculating section that calculates a spectrum of the target signal by performing a Fourier transform on sampling data acquired by sampling, with a prescribed period, a signal level of the target signal;
a data converting section that rearranges each of a plurality of frequency components in the spectrum such that (i) a fundamental wave component and harmonic wave components of the target signal are within a first Nyquist region of the spectrum and (ii) image components of the fundamental wave component and the harmonic wave components are within a second Nyquist region of the spectrum;
a band limiting section that eliminates the frequency components in the second Nyquist region of the spectrum output by the data converting section; and
an analytic signal generating section that generates the analytic signal by converting the spectrum output by the band limiting section into a signal in the time domain.

27. A non-transitory recording medium storing thereon a program that causes a computer to function as a distortion detecting apparatus for detecting non-linear distortion of a target signal, the program causing the computer to function as:
a spectrum calculating section that calculates a spectrum of the target signal;
a data converting section that rearranges each of a plurality of frequency components in the spectrum such that (i) a fundamental wave component and harmonic wave components of the target signal are within a first Nyquist region of the spectrum and (ii) image components of the fundamental wave component and the harmonic wave components are within a second Nyquist region of the spectrum; and
a distortion detecting section that detects the non-linear distortion of the target signal caused by each harmonic wave component, based on each harmonic wave component having a prescribed order number in the spectrum in which each frequency component has been rearranged by the data converting section.

28. A non-transitory recording medium storing thereon a program that causes a computer to function as a signal compensation apparatus that compensates for non-linear distortion in a target signal, the program causing the computer to function as:

an analytic signal generating section that generates an analytic signal of the target signal;

a compensation signal generating section that generates compensation signals that compensate for the non-linear distortion of the target signal, based on signals obtained by raising the analytic signal to powers; and a compensating section that compensates for the non-linear distortion by subtracting each compensation signal from the target signal, wherein the program causes the analytic signal generating section of the computer to function as:

a spectrum calculating section that calculates a pre-compensated spectrum of the target signal by performing a Fourier transform on sampling data acquired by sampling, with a prescribed period, a signal level of the target signal;

a data converting section that rearranges each of a plurality of frequency components in the pre-compensated spectrum such that (i) a fundamental wave component and harmonic wave components of the target signal are within a first Nyquist region of the pre-compensated spectrum and (ii) image components of the fundamental wave component and the harmonic wave components are within a second Nyquist region of the pre-compensated spectrum;

a band limiting section that eliminates the frequency components in the second Nyquist region of the pre-compensated spectrum output by the data converting section; and an inverse Fourier transform section that generates the analytic signal by converting the pre-compensated spectrum output by the band limiting section into a signal in the time domain.

29. A non-transitory recording medium storing thereon a program that causes a computer to function as an analytic signal generating apparatus that generates an analytic signal of a target signal based on a sampling result of the target signal, the program causing the computer to function as:

a spectrum calculating section that calculates a spectrum of the target signal by performing a Fourier transform on sampling data acquired by sampling, with a prescribed period, a signal level of the target signal;

a data converting section that rearranges each of a plurality of frequency components in the spectrum such that (i) a fundamental wave component and harmonic wave components of the target signal are within a first Nyquist region of the spectrum and (ii) image components of the fundamental wave component and the harmonic wave components are within a second Nyquist region of the spectrum;

a band limiting section that eliminates the frequency components in the second Nyquist region of the spectrum output by the data converting section; and an analytic signal generating section that generates the analytic signal by converting the spectrum output by the band limiting section into a signal in the time domain.

30. A distortion detecting method for detecting non-linear distortion of a target signal, comprising:

calculating a spectrum of the target signal;

detecting a phase of a fundamental wave component of the target signal based on the spectrum of the target signal;

rearranging each of a plurality of frequency components in the spectrum such that (i) the fundamental wave component and harmonic wave components of the target signal are within a first Nyquist region of the spectrum and (ii) image components of the fundamental wave component and the harmonic wave components are within a second Nyquist region of the spectrum;

rotating the phase of each frequency component in the spectrum in which each frequency component has been rearranged, based on the phase of the fundamental wave component; and detecting the non-linear distortion of the target signal caused by each harmonic wave component, based on each harmonic wave component having a prescribed order number in the spectrum in which the phase of each frequency component has been rotated.

31. A signal compensation method for compensating for non-linear distortion in a target signal, comprising:

generating an analytic signal of the target signal;

generating compensation signals that compensate for the non-linear distortion of the target signal, based on signals obtained by raising the analytic signal to powers; and compensating for the non-linear distortion by subtracting from the target signal compensation signals that have each been multiplied by coefficients, wherein generating the analytic signal includes:

calculating a pre-compensated spectrum of the target signal by performing a Fourier transform on sampling data acquired by sampling, with a prescribed period, a signal level of the target signal;

rearranging each of a plurality of frequency components in the pre-compensated spectrum such that (i) a fundamental wave component and harmonic wave components of the target signal are within a first Nyquist region of the pre-compensated spectrum and (ii) image components of the fundamental wave component and the harmonic wave components are within a second Nyquist region of the pre-compensated spectrum;

eliminating the frequency components in the second Nyquist region of the pre-compensated spectrum; and generating the analytic signal by converting the pre-compensated spectrum from which the frequency components in the second Nyquist region have been eliminated into a signal in the time domain.

32. An analytic signal generating method for generating an analytic signal of a target signal based on a sampling result of the target signal, comprising:

calculating a spectrum of the target signal by performing a Fourier transform on sampling data acquired by sampling, with a prescribed period, a signal level of the target signal;

rearranging each of a plurality of frequency components in the spectrum such that (i) a fundamental wave component and harmonic wave components of the target signal are within a first Nyquist region of the spectrum and (ii) image components of the fundamental wave component and the harmonic wave components are within a second Nyquist region of the spectrum;

eliminating the frequency components in the second Nyquist region of the spectrum in which each frequency component has been rearranged; and generating the analytic signal by converting the spectrum from which the frequency components in the second Nyquist region have been eliminated into a signal in the time domain.

* * * * *